US009165636B2

(12) United States Patent
Muroyama et al.

(10) Patent No.: US 9,165,636 B2
(45) Date of Patent: Oct. 20, 2015

(54) MEMORY MANAGEMENT UNIT FOR MANAGING A STATE OF MEMORY, IMAGE PROCESSING DEVICE, AND INTEGRATED CIRCUIT

(71) Applicant: Panasonic Corporation, Osaka (JP)

(72) Inventors: Takashi Muroyama, Nara (JP); Miho Tokieda, Kyoto (JP); Shinichi Takada, Osaka (JP); Koji Yamada, Shiga (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 182 days.

(21) Appl. No.: 13/746,509

(22) Filed: Jan. 22, 2013

(65) Prior Publication Data
US 2013/0132662 A1 May 23, 2013

Related U.S. Application Data

(63) Continuation of application No. PCT/JP2011/004270, filed on Jul. 28, 2011.

(30) Foreign Application Priority Data

Jul. 29, 2010 (JP) .................................. 2010-171131

(51) Int. Cl.
*G11C 11/406* (2006.01)
*G06F 1/32* (2006.01)
(52) U.S. Cl.
CPC ........ *G11C 11/40618* (2013.01); *G06F 1/3225* (2013.01); *G06F 1/3275* (2013.01); *Y02B 60/1225* (2013.01); *Y02B 60/1228* (2013.01)

(58) Field of Classification Search
None
See application file for complete search history.

(56) References Cited

U.S. PATENT DOCUMENTS

| 5,928,365 | A | 7/1999 | Yoshida |
| 6,192,446 | B1 * | 2/2001 | Mullarkey et al. ............ 711/105 |
| 6,385,691 | B2 * | 5/2002 | Mullarkey et al. ............ 711/105 |
| 6,775,716 | B2 * | 8/2004 | Tojima et al. .................. 710/22 |
| 7,490,258 | B2 | 2/2009 | Sakamoto et al. |

(Continued)

FOREIGN PATENT DOCUMENTS

| CN | 1573675 A | 2/2005 |
| JP | 9-212416 | 8/1997 |

(Continued)

OTHER PUBLICATIONS

International Search Report of PCT Application No. PCT/JP2011/004270 dated Aug. 30, 2011.
Chinese Office Action issued in Chinese Application No. 201180034633.9 dated Feb. 16, 2015, with partial English translation.

*Primary Examiner* — Kevin Verbrugge
(74) *Attorney, Agent, or Firm* — McDermott Will & Emery LLP

(57) ABSTRACT

A memory management unit manages a state of a memory which is to be accessed by bank interleaving. The memory includes p banks (where p is an integer of 2 or greater). The memory management unit includes a control unit that dynamically determines a bank to be accessed from among the p banks. When predetermined conditions for a reserving state of the memory are satisfied and there is any unused bank in the p banks, the control unit performs power consumption reduction to control the memory to cause power consumption of the unused bank(s) to be less than power consumption of other banks in the p banks except the unused bank(s).

10 Claims, 13 Drawing Sheets

(56) References Cited

U.S. PATENT DOCUMENTS

| | | | |
|---|---|---|---|
| 2001/0003512 A1* | 6/2001 | Mullarkey et al. | 365/200 |
| 2002/0026543 A1* | 2/2002 | Tojima et al. | 710/22 |
| 2004/0243877 A1 | 12/2004 | Sakamoto et al. | |

FOREIGN PATENT DOCUMENTS

| | | |
|---|---|---|
| JP | 2001-101067 | 4/2001 |
| JP | 2006-109224 | 4/2006 |
| JP | 2006-215961 | 8/2006 |

\* cited by examiner

MEMORY MANAGEMENT UNIT FOR MANAGING A STATE OF MEMORY, IMAGE PROCESSING DEVICE, AND INTEGRATED CIRCUIT

CROSS REFERENCE TO RELATED APPLICATION(S)

This is a continuation application of PCT Patent Application No. PCT/JP2011/004270 filed on Jul. 28, 2011, designating the United States of America, which is based on and claims priority of Japanese Patent Application No. 2010-171131 filed on Jul. 29, 2010. The entire disclosures of the above-identified applications, including the specifications, drawings and claims are incorporated herein by reference in their entirety.

FIELD

The present invention relates to memory management units, image processing devices, and integrated circuits all of which manage a memory which is to be accessed by bank interleaving.

BACKGROUND

In recent years, as system Large Scale Integrations (LSIs) have been complicated and speeding up, operation frequency and power consumption of Dynamic Random Access Memories (DRAMs) have been increased. Therefore, a ratio of power consumption of a DRAM to power consumption of a system is increased, which results in a problem of preventing power saving for the DRAM.

For power saving of DRAM, Patent Literature 1 discloses a technique (hereinafter, referred to as "conventional technique A") of changing address mapping from a logical address to a physical address according to an operation mode to set a physical memory region to which no access occur, thereby stopping the physical memory region.

On the other hand, Patent Literature 2 discloses a technique (hereinafter, referred to as "conventional technique B") of performing address mapping to selectively perform, based on a logical address to be accessed, a method of accessing the same bank or a method of accessing by bank interleaving. In conventional technique B, when the method of accessing the same bank is used, it is possible to reduce power consumption.

CITATION LIST

Patent Literatures

Patent Literature 1: Japanese Unexamined Patent Application Publication No. 2006-109224
Patent Literature 2: Japanese Unexamined Patent Application Publication No. 2006-215961

SUMMARY

Technical Problem

However, conventional techniques A and B have the following problems.

In conventional technique A, power consumption can be reduced only in the operation mode for setting a physical memory region to which no access occur, by stopping the physical memory region.

In conventional technique B, power consumption can be reduced only when processing of accessing the same bank is performed.

More specifically, conventional techniques A and B have problems of failing to reduce power consumption of an unused bank which is caused by change in a reserving state of a memory which is to be accessed by bank interleaving.

In order to address the above-described problems, an object of the present invention is to provide a memory management unit or the like which is capable of reducing power consumption of an unused bank which is caused by change in a reserving state of a memory which is to be accessed by bank interleaving.

Solution to Problem

In accordance with an aspect of the present invention for achieving the object, there is provided a memory management unit that manages a state of a memory which is to be accessed by bank interleaving, the memory including p banks (where p is an integer of 2 or greater), and the memory management unit comprising a control unit configured to dynamically determine, from among the p banks, a bank to be accessed, wherein, when a predetermined condition for a reserving state of the memory is satisfied and an unused bank not to be accessed exists in the p banks, the control unit is configured to perform power consumption reduction to control the memory to cause power consumption of the unused bank to be less than power consumption of other bank in the p banks except the unused bank.

That is, the memory management unit uses a memory which is to be accessed by bank interleaving. The control unit performs processing for dynamically determining a bank(s) to be accessed from among p banks. When the predetermined conditions for the memory reserving state are satisfied and there is any unused bank, the control unit performs the power consumption reduction to control the memory to cause power consumption of the unused bank(s) to be less than power consumption of the other bank(s) except of the unused bank(s).

In other words, in the memory which is to be accessed by bank interleaving, if the predetermined conditions for the memory reserving state are satisfied and there is an unused bank, power consumption reduction is performed to control the memory to cause power consumption of the unused bank(s) to be less than power consumption of the other bank(s) except the unused bank(s).

As a result, when the memory reserving state is changed in the processing for dynamically determining a bank to be accessed, if the predetermined conditions for the memory reserving state are satisfied and there is any unused bank, it is possible to reduce power consumption of the unused bank.

Therefore, the memory management unit according to the aspect of the present invention can reduce power consumption of the unused bank which results from the change in the reserving state of the memory which is to be accessed by bank interleaving. As a result, it is possible to efficiently reduce power consumption of the memory according to the change in the memory reserving state.

It is preferable that the memory has a function of performing auto refresh processing and a function of performing self refresh processing, the functions being used to hold data, a power consumption requirement of the self refresh processing is lower than a power consumption requirement or the auto refresh processing, the control unit includes a power consumption control unit configured to perform the power consumption reduction to control the memory to perform the self refresh processing on the unused bank, wherein the auto refresh processing is performed on the other bank except the unused bank.

It is further preferable that the memory includes u memory regions (where u is an integer of 4 or greater), the u memory regions being arranged in a matrix in one of a physical memory space and a logical memory space, the u memory regions form a region matrix in n rows (where n is an integer of 2 or greater) and p columns, each of the p banks corresponds to a corresponding one of the p columns in the region matrix, each of the p banks includes n memory regions that correspond to a column corresponding to the each of the p banks in the region matrix, the memory includes n unit regions to be accessed by bank interleaving, each of the n unit regions corresponds to a corresponding one of the n rows in the region matrix, each of the n unit regions includes p memory regions that correspond to a row corresponding to the each of the n unit regions in the region matrix, each of the n unit regions corresponds to a corresponding one of n segments necessary in accessing the memory, each of the n segments indicates identification information for identifying a reserved region that is a memory region reserved by the each of the n segments from among the p memory regions included in a unit region corresponding to the each of the n segments, the control unit includes a segment setting unit configured to update identification information indicated by a segment to be updated from among the n segments, for each processing which requires to update the segment and is performed to access the unit region, and the predetermined condition is that a total capacity of all of reserved regions identified by respective pieces of the identification information most recently indicated by the respective segments is no greater than a predetermined first threshold value.

It is still further preferable that the memory includes u memory regions (where u is an integer of 4 or greater), the u memory regions being arranged in a matrix in one of a physical memory space and a logical memory space, the u memory regions form a region matrix in n rows (where n is an integer of 2 or greater) and p columns, each of the p banks corresponds to a corresponding one of the p columns in the region matrix, each of the p banks includes n memory regions that correspond to a column corresponding to the each of the p banks in the region matrix, the memory includes n unit regions to be accessed by bank interleaving, each of the n unit regions corresponds to a corresponding one of the n rows in the region matrix, each of the n unit regions includes p memory regions that correspond to a row corresponding to the each of the n unit regions in the region matrix, each of the n unit regions corresponds to a corresponding one of n segments necessary in accessing the memory, each of the n segments indicates identification information for identifying a reserved region that is a memory region reserved by the each of the n segments from among the p memory regions included in a unit region corresponding to the each of the n segments, each of the n segments indicates effectiveness determination information indicating whether or not the each of the n segments is effective, the control unit includes a segment setting unit configured to update at least one of (a) identification information indicated by a segment to be updated from among the n segments, and (b) the effectiveness determination information indicated by the segment to be updated, for each processing which requires to update the segment and is performed to access the unit region, and the predetermined condition is that (i) a total capacity of all of reserved regions identified by respective pieces of the identification information most recently indicated by the respective segments is no greater than a predetermined first threshold value and (ii) a total number of segments indicated as effective is no greater than a predetermined second threshold value.

Since two elements which are the total capacity of the reserved regions and the total number of effective segments are used, it is possible to more efficiently reduce power consumption of the memory.

It is still further preferable that the predetermined second threshold value is smaller than n/2.

It is still further preferable that the predetermined first threshold value is smaller than a half of a total capacity of the u memory regions.

It is still further preferable that each of the n segments indicates a start address of a corresponding one of the unit regions.

It is still further preferable that the identification information indicates a capacity reserved by a segment indicating the identification information, the identification information being indicated in a unit region corresponding to the segment, and the capacity indicated in the identification information is set for each of the p memory regions corresponding to a bank corresponding to the unit region.

In accordance with another aspect of the present invention for achieving the object, there is provided an image processing device performing image processing using the memory management unit according to the above aspect.

In accordance with still another aspect of the present invention for achieving the object, there is provided an integrated circuit that manages a state of a memory which is to be accessed by bank interleaving, the memory including p banks (where p is an integer of 2 or greater), and the integrated circuit comprising a control unit configured to dynamically determine, from among the p banks, a bank to be accessed, wherein, when a predetermined condition for a reserving state of the memory is satisfied and an unused bank not to be accessed exists in the p banks, the control unit is configured to perform power consumption reduction to control the memory to cause power consumption of the unused bank to be less than power consumption of other bank in the p banks except the unused bank.

The present invention may be implemented as a memory management method including steps performed by the characteristic structural elements included in the memory management unit. Furthermore, the present invention may be implemented as a program causing a computer to perform the steps included in the memory management method. The present invention may be implemented as a computer-readable recording medium on which the program is recorded. The program may be distributed via a recording medium such as the Internet.

Advantageous Effects

According to the present invention, it is possible to reduce power consumption of an unused bank which is caused by change of a reserving state of a memory.

BRIEF DESCRIPTION OF DRAWINGS

These and other objects, advantages and features of the invention will become apparent from the following description thereof taken in conjunction with the accompanying drawings that illustrate a specific embodiment of the present invention.

DESCRIPTION OF EMBODIMENTS

Figure 1:
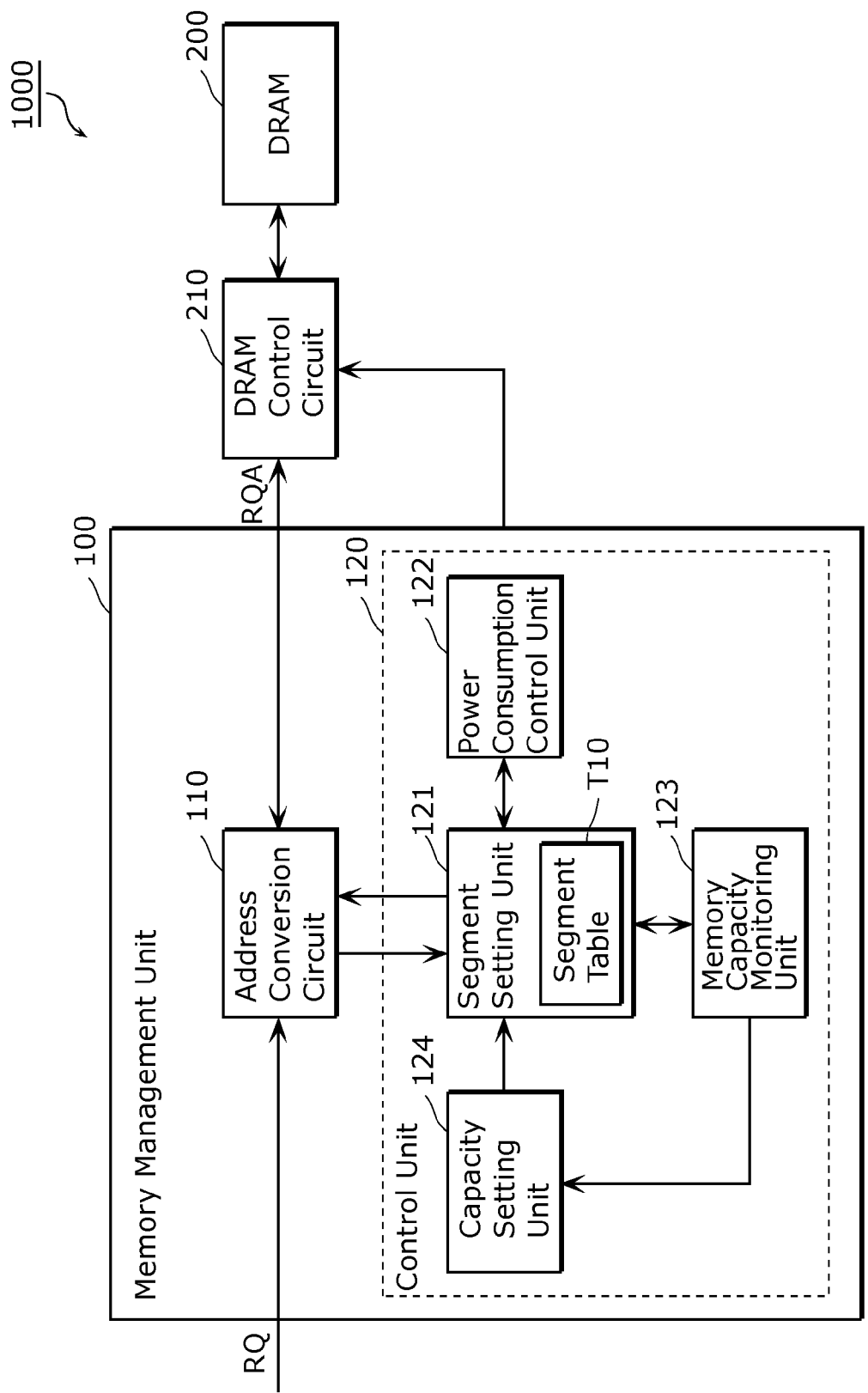
FIG. 1 is a block diagram showing a structure of a data storage device according to Embodiment 1.

The following describes embodiments of the present invention with reference to the drawings. In the following description, the same reference numerals are assigned to identical structural elements. The identical structural elements have the same names and functions. Therefore, detailed description of identical structural elements will sometimes not be repeated.

(Embodiment 1)

FIG. 1 is a block diagram showing a structure of a data storage device 1000 according to Embodiment 1.

The data storage device 1000 includes a Memory Management Unit (MMU) 100, a Dynamic Random Access Memory (DRAM) 200, and a DRAM control circuit 210.

The memory management unit 100 manages of a state of the DRAM 200 that is a memory, according to a segment method as a memory management method. The memory management unit 100 performs processing for converting a logical address to a physical address, which will be described later in more detail.

In order to hold data stored in the DRAM 200, the DRAM 200 has a function of performing auto refresh processing, and a function of performing self refresh processing. The auto refresh processing is performed according to instructions from an external circuit (not shown). Since the auto refresh processing is well known, it is not described in detail.

In particular, the DRAM 200 has the function of performing partial self refresh processing which is self refreshing performed on a part of the DRAM 200. Furthermore, the DRAM 200 is a memory which is to be accessed by bank interleaving (memory interleaving). The bank interleaving is a technique of increasing a speed of memory access by accessing a plurality of banks in parallel. Since the bank interleaving processing is a well known technique, it is not described in detail.

Here, regarding the DRAM 200, a power consumption requirement of self refresh processing is lower than a power consumption requirement of auto refresh processing.

In the description, "access" is a general term for storage (memory) and reading of data.

Moreover, a memory managed by the memory management unit 100 is not limited to a DRAM, but may be any other volatile memory as far as the memory regularly needs to perform auto refresh processing to hold data.

Figure 2:
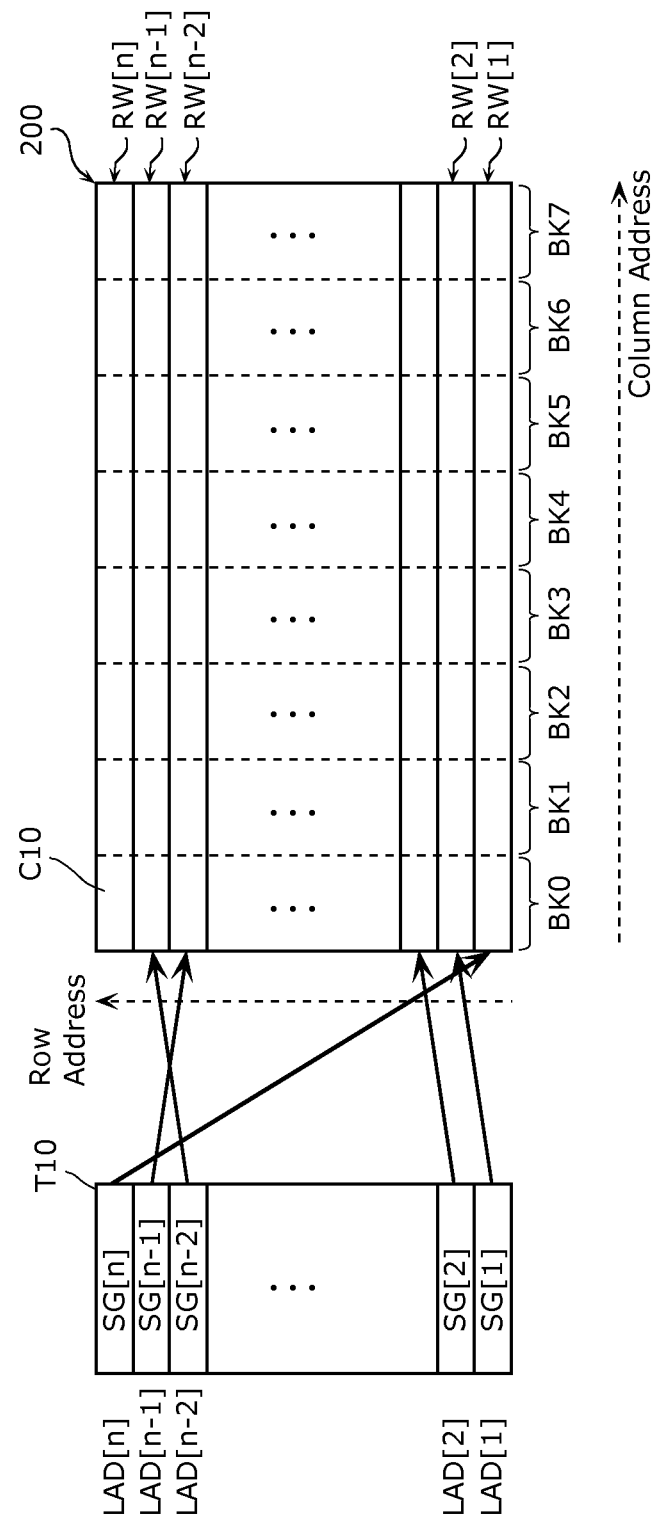
FIG. 2 is a diagram for explaining a DRAM.

FIG. 2 is a diagram for explaining the DRAM 200.

For explanation, FIG. 2 shows a segment table T10 used to manage the DRAM 200. The segment table T10 includes a plurality of segments which will be described later in more detail. Each of the segments stores information for converting a logical address to a physical address. Each of the segments according to the present embodiment further stores information for reserving a region.

The DRAM 200 has u memory regions C10 (where 4 is an integer of 4 or greater) which are arranged in a matrix (in rows and columns). The u memory regions C10 form a matrix (hereinafter, referred to as a "region matrix") having n rows (where n is an integer of 2 or greater) and p columns (where p is an integer of 2 or greater). In the region matrix, n memory regions C10 which corresponding to a corresponding one of the p columns forms a single bank.

In other words, the DRAM 200 includes p banks.

Each of the p banks corresponds to a corresponding one of the p columns in the region matrix. Each of the p banks includes n memory regions corresponding to a column corresponding to the bank in the region matrix. According to the present embodiment, it is assumed that p=8. Therefore, the DRAM 200 is assumed, for example, to have eight banks (banks BK0, BK1, BK2, BK3, BK4, BK5, BK6, and BK7).

Here, the number of banks included in the DRAM 200 is not limited to 8, but may be 4, 16, 24, or the like.

Each of the u memory regions C10 is specified by a row address and a column address.

It should be noted that the DRAM 200 may include a plurality of DRAMs. It is also possible that the u memory regions C10 are not arranged in a matrix in a physical memory space. In this case, the u memory regions C10 shown in FIG. 2 are arranged in a matrix in a logical memory space.

In other words, the DRAM 200 includes u memory regions C10 which are arranged in a matrix in a physical memory space or a logical memory space.

In the DRAM 200, access is permitted to one or more memory regions C10 reserved by respective segments. Hereinafter, a memory region C10 reserved by a segment is referred to also as a "reserved region". The reserved region is a region to which access is possible. Hereinafter, a memory region C10 not reserved by a segment is referred to also as a "not-reserved region". The not-reserved region is a region to which access is impossible.

Hereinafter, all of the memory regions C10 in the DRAM 200 are also referred to as "all memory regions". Hereinafter, a total capacity of all of the memory regions C10 in the DRAM 200 is also referred to as a "maximum memory capacity". In other words, a capacity of the entire I memory region is the maximum memory capacity.

From among the u memory regions C10, p memory regions C10 corresponding to a corresponding row of the n rows in the region matrix form a region (hereinafter, referred to also as a "unit region") corresponding to the corresponding row. In other words, p memory regions C10 corresponding to a corresponding row of the n rows in the region matrix forms a single unit region. The unit region is a region to be accessed by bank interleaving. The u memory regions C10 from n unit regions. In other words, the DRAM 200 as a memory includes n unit regions.

Each of the n unit regions corresponds to a corresponding row of the n rows in the region matrix. Each of the n unit regions includes p memory regions which correspond to a corresponding row that corresponds to the unit region in the region matrix The DRAM 200 includes unit regions RW[1], RW[2], ..., RW[n].

Hereinafter, each of the unit regions RW[1], RW[2], ..., RW[n] is also referred to simply as a "unit region RW". Therefore, the DRAM 200 includes n unit regions RW. In other words, the all memory regions of the DRAM 200 are segmented into n unit regions RW. Each of the n unit regions RW has the same memory capacity.

Furthermore, the number of segments included in the segment table T10 is equal to the number of the unit regions RW.

In other words, the segment table T10 includes segments SG[1], SG[2], ..., SG[n]. The segments SG[1], SG[2], ..., SG[n] are associated with logical addresses LAD[1], LAD[2], ..., LAD[n], respectively.

Hereinafter, each of the segments SG[1], SG[2], ..., SG[n] is also referred to simply as a "segment SG". In other words, the segment table T10 includes n segments SG. Although it will be described later in more detail, the segment SG stores information necessary for access to the DRAM 200 as a memory. Therefore, the segment SG is necessary when the DRAM 200 as a memory is accessed.

It should be noted that the number of the segments included in the segment table T10 may be different from the number of the unit regions RW. For example, a single segment SG may be associated with a plurality of unit regions RW.

Although it has been described that the rows correspond to the respective unit regions and the columns correspond to the respective banks in the region matrix, the present invention is not limited to the above structure. It is also possible that the rows correspond to the respective banks and the columns correspond to the respective unit regions in the region matrix.

Hereinafter, each of the logical addresses LAD[1], LAD[2], ..., LAD[n] is also referred to simply as a "logical address LAD".

It is assumed in the present embodiment that each of the n unit regions RW includes eight memory regions C10, for example. The eight memory regions C10 included in each of the unit regions RW correspond to the respective different banks. Hereinafter, a memory region C10 corresponding to a bank is referred to also as a "bank-corresponding region".

For example, in the unit region RW[1], a memory region C10 corresponding to the bank BK0 is a bank-corresponding region corresponding to the bank BK0.

Each of the n unit regions RW is managed by various kinds of information indicated by a segment SG corresponding to the unit region RW.

Figure 3:
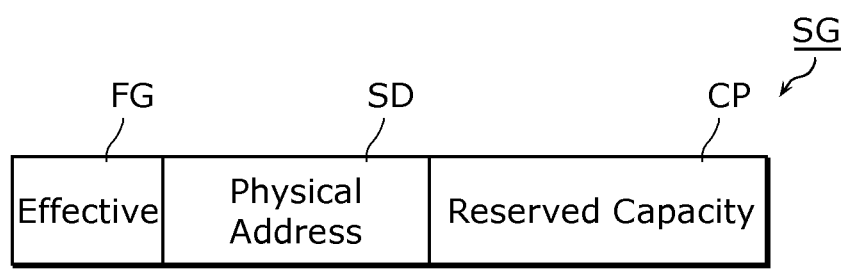
FIG. 3 is a diagram for explaining segments.

FIG. 3 is a diagram for explaining segments SG.

With reference to FIG. 3, a segment SG indicates effectively determination information FG, a physical address SD, and a reserved capacity CR Effectively determination information FG is information indicating whether or not a segment SG indicating the effectively determination information FG is effective. Effectively determination information FG indicates "effective" or "no effect". If effectively determination information FG indicates "effective", a segment SG indicating the effectively determination information FG is effective. If effectively determination information FG indicates "no effect", the segment SG indicating the effectively determination information FG is not effective.

Here, in the initial state, effectively determination information FG indicated by each of n segments SG included in the segment table T10 indicates "no effect".

In other words, each of the n segments indicates effectively determination information FG that indicates whether or not the segment is effective.

A physical address SD is the first address (start address) of a corresponding one of the n unit regions RW. The first address of each of the unit regions RW corresponding to a row address in FIG. 2. In other words, a unit region RW identified by a physical address SD indicated by a segment SD is associated with the segment SG. Physical addresses SD indicated by the respective n segments SG are different first addresses of the respective unit regions RW.

Therefore, the n segments SG are associated with the n unit regions RW, respectively. In other words, each of the n unit regions RW is associated with a corresponding one of the n segments which are necessary for accessing the DRAM 200 as a memory. Each of the n segments SG indicates a first address (physical address SD) of a corresponding one of the unit regions RW.

Here, for example, it is assumed that a physical address SD indicated by the segment SG[1] is a first address of the unit region RW[2], and a physical address SD indicated by the segment SG[n] is a first address of the unit region RW[1].

In this case, as shown in FIG. 2, for example, the segment SG[1] is associated with the unit region RW[2], and the segment SG[n] is associated with the unit region RW[1]. As described above, each of the segments SG is associated with a corresponding logical address LAD.

Therefore, by using the segment table T10, in the DRAM 200, to each of the memory regions C10 to be accessed which do not have consecutive physical addresses, it is possible to access by using consecutive logical addresses.

The reserved capacity CP is a capacity which a segment SG indicating the reserved capacity CP reserves for a unit region RW corresponding to the segment SG.

Here, in the initial state, a reserved capacity CP indicated by each of n segments SG included in the segment table T10 is set to 0 (byte).

By the segment method, a maximum capacity of a reserved capacity CP indicated by a segment SG varies according to a capacity of the DRAM 200.

Here, for example, it is assumed that a physical address SD indicated by the segment SG[n] is a first address (start address) of the unit region RW [1]. It is also assumed that a reserved capacity CP indicates a total capacity of four memory regions C10, for example. In this case, in the unit region RW[1] of the DRAM 200, four bank-corresponding regions (memory regions C10) corresponding to the banks BK0 to BK3, respectively, are reserved regions.

In other words, a reserved capacity CP is identification information for identifying a reserved region that is a memory region which a segment SG indicating the reserved capacity CP reserves. In other words, each of the n segments SG indicates identification information (reserved capacity CP) for identifying a reserved region.

In other words, each of the n segments SG indicates identification information for identifying a reserved region that is a memory region reserved by the segment from among p memory regions forming a unit region corresponding to the segment.

Referring back to FIG. 1, the memory management unit 100 includes an address conversion circuit 110 and a control unit 120.

The address conversion circuit 110 performs processing for converting a logical address to a physical address, which will be described later in more detail.

The control unit 120 includes a segment setting unit 121, a power consumption control unit 122, a memory capacity monitoring unit 123, and a capacity setting unit 124.

The segment setting unit 121 has the above-described segment table T10 used to manage the DRAM 200.

The memory capacity monitoring unit 123 monitors a capacity of a region reserved by each of the segments, which will be described in more detail later.

The capacity setting unit 124 performs processing for setting a reserved capacity CP of each of the segment SG, which will be described in more detail later.

The power consumption control unit 122 performs processing for constantly monitoring the segment table T10, and when there is an unused bank, reducing power consumption of the DRAM 200.

Since the processing performed by the address conversion circuit 110 is well known as used by the memory management units (MMUs), it will not be described in detail. The following describes it briefly.

The address conversion circuit 110 receives a memory access request RQ transmitted from an external Central Processing Unit (CPU) or the like. The memory access request RQ is a request for accessing a certain unit region RW in the DRAM 200. The memory access request RQ indicates a logical address LAD corresponding to the unit region RW to be accessed.

In addition, the memory access request RQ indicates either a data storing instruction or a data reading instruction. The data storing instruction is for instructing to store data. The data reading instruction is for instructing to read data. If a memory access request RQ indicates a data storing instruction, the memory access request RQ is added with data to be stored.

The address conversion circuit 110 performs address conversion, every time a memory access request RQ is received.

In the address conversion, the address conversion circuit 110 selects, with reference to the segment table T10, a segment SG corresponding to a logical address AD indicated in a received memory access request RQ.

Then, the address conversion circuit 110 obtains a physical address SD indicated in the selected segment SG as a physical address of the unit region RW to be accessed. In other words, the address conversion circuit 110 converts the logical address LAD indicated in the memory access request RQ to the physical address.

The segment setting unit 121 changes effectiveness determination information FG of a segment SG selected by the address conversion circuit to indicate "effective", when the effectiveness determination information FG indicates "no effect" in the segment table T10.

As described later in more detail, the segment setting unit 121 changes the effectiveness determination information FG and also sets a value of a reserved capacity CP of the segment SG selected by the address conversion circuit 110.

Thereby, the selected segment SG is updated and thereby the segment table T10 is also updated.

More specifically, the segment setting unit 121 updates identification information (reserved capacity CP) indicted by the segment to be updated, for each processing which requires to update the segment and is performed to access the unit region RW. Here, the processing, for which segment updating is necessary and which is performed for accessing the unit region RW, is the above-described address conversion using the memory access request RQ that requires updating of the segment.

In other words, the processing, for which segment updating is necessary and which is performed for accessing the unit region, is processing which causes a change in a state of the memory (DRAM 200) and is used to access the memory (DRAM 200).

The processing performed by the segment setting unit 121 to update identification information (reserved capacity CP) indicated by the segment to be updated is processing for automatically determining (setting) a bank to be accessed from among p banks.

Then, the address conversion circuit 110 replaces the logical address LAD indicted in the memory access request RQ to the obtained physical address, thereby generating a memory access request RQA, and transmits the resulting memory access request RQA to the DRAM control circuit 210. Therefore, the memory access request RQA differs from the memory access request RQ in only that a physical address obtained instead of the logical address LAD is indicated.

The DRAM control circuit 210 accesses the DRAM 200 according to the memory access request RQA.

More specifically, when a memory access request RQA indicates a data storing instruction, the DRAM control circuit 210 performs, by bank interleaving, data storing processing for storing data added in the memory access request RQA into the DRAM 200. In the data storing processing, a region in which the data is to be stored is a unit region RW having the physical address indicated in the memory access request RQA.

On the other hand, when the memory access request RQA indicates a data reading instruction, the DRAM control circuit 210 performs, by bank interleaving, data reading processing for reading data from the DRAM 200. In the data reading processing, a region from which the data is to be read is a unit region RW having the physical address indicated in the memory access request RQA.

In the data reading processing, the DRAM control circuit 210 transmits the readout data to an external CPU or the like via the address conversion circuit 110.

It should be noted that the DRAM control circuit 210 accesses only a region designated by an access region limiting instruction from among the regions in the DRAM 200, when the access region limiting instruction, which will be describe later, is received.

It should be noted that in the conventional segment method, a capacity of a region reserved by a segment is fixed in a period during memory accessing.

In the present embodiment, on the other hand, in the period during which the capacity of the DRAM 200 is fixed and the DRAM 200 is accessed, a reserved capacity CP indicated by a segment SG is dynamically changed. In other words, in each of the unit regions RW, the number of the memory regions C10 to which access is permitted is dynamically changed. More specifically, in accessing the DRAM 200, a row address is fixed and a column address (bank) is varied.

In other words, in the present embodiment, by changing the number of bank-corresponding regions to be accessed by bank interleaving, banks to which access is not permitted exist.

In the present embodiment, a reserved capacity CP is gradually switched for a capacity of each bank-corresponding region. In the case of memory accessing by bank interleaving, at least four banks are necessary to achieve memory accessing without decreasing access efficiency.

In other words, for a memory including eight banks, any of the following five kinds of capacities is set as a reserved capacity CP. The five kinds of capacities are capacities of 4, 5, 6, 7, and 8 bank-corresponding regions.

In the present embodiment, for the sake of simplicity in the description, it is assumed that there are two kinds of capacities for a reserved capacity CP: a capacity of four bank-corresponding regions and a capacity of eight bank-corresponding regions (capacity of the unit region RW). Hereinafter, a capacity of the unit region RW is referred to also as a "unit region maximum capacity".

The memory capacity monitoring unit 123 performs capacity monitoring for monitoring a total capacity of all reserved regions in the DRAM 200, every time a predetermined time (for example, 1 microsecond) has passed. In other words, the memory capacity monitoring unit 123 constantly monitors a total capacity of all reserved regions in the DRAM 200.

In the capacity monitoring, the memory capacity monitoring unit 123 identifies all of segments SG each having effectivity determination information FG indicating "effective", from among the n segments SG included in the segment table T10. Hereinafter, a segment SG having effectiveness determination information FG indicating "effective" is referred to also as an "effective segment".

Then, the memory capacity monitoring unit 123 sums reserved capacities CP indicated by all of the effective segments, thereby obtaining a total capacity of all of the reserved regions in the DRAM 200. Hereinafter, a total capacity of all of the reserved regions in the DRAM 200 is referred to as a "reserved region total capacity".

The memory capacity monitoring unit 123 notifies the reserved region total capacity to the capacity setting unit 124, every time the reserved region total capacity is calculated. Then, this capacity monitoring is completed.

In the capacity monitoring, a ratio of the reserved region total capacity to the maximum memory capacity of the DRAM 200 may be calculated as a capacity reservation rate.

Here, for example, the maximum memory capacity is assumed to be 1000 megabytes. As another example, the reserved region total capacity is assumed to be 500 megabytes. In this case, the capacity reservation rate is 0.5 (50%).

Here, it is assumed that the capacity reservation rate of the DRAM 200 is 50%. In this case, for example, the reserved capacity CP indicated by each of the n segments SG is 50% of a capacity of a unit region RW corresponding to a segment SG indicating the reserved capacity CP.

Here, it is assumed that the DRAM 200 includes eight banks, for example. In this case, it is possible to operate the DRAM 200 by interleaving, by using four banks in the all memory regions of the DRAM 200. In this case, all of the n segments SG are effective.

In other words, in a physical memory space (in practice), only a half of the all memory regions of the DRAM 200 are reserved regions and a remaining half of the all memory regions are capable of storing data but are not used.

Hereinafter, in the unit region RW, the processing by interleaving using k bank-corresponding regions (where k is a natural number) is referred to also as "k-bank interleaving". For example, in the unit region RW, the processing by interleaving using four bank-corresponding regions is referred to also as "four-bank interleaving".

However, if n segments SG are effective, it is considered in the logical memory space that all of the entire regions (all memory regions) in the DRAM 200 are currently used. Therefore, it is impossible to store further data into the DRAM 200.

In order to prevent this, in the present embodiment, based on the reserved region total capacity of the DRAM 200, processing is performed to set the reserved capacity CP to either a first capacity or a second capacity (hereinafter, the processing is referred to as "capacity setting").

Here, for example, the first capacity is assumed to be a capacity of four bank-corresponding regions. The second capacity is assumed to be a capacity of the unit region RW (unit region maximum capacity). Therefore, the second capacity is assumed to be a capacity of eight bank-corresponding regions. In other words, a reserved capacity CP as identification information is set for each of memory regions corresponding to the banks.

Here, the second capacity is not limited to the capacity of eight bank-corresponding regions, but may be any capacity as far as the second capacity is larger than the capacity of four bank-corresponding regions. For example, the second capacity may be a capacity of seven bank-corresponding regions.

In the present embodiment, in the capacity setting, it is possible to prevent that a reserved capacity CP of a segment SG cannot be set although there is a memory region to which data can be stored.

More specifically, even time the memory capacity monitoring unit 123 notifies a reserved region total capacity to the capacity setting unit 124, the capacity setting is performed.

Figure 4:
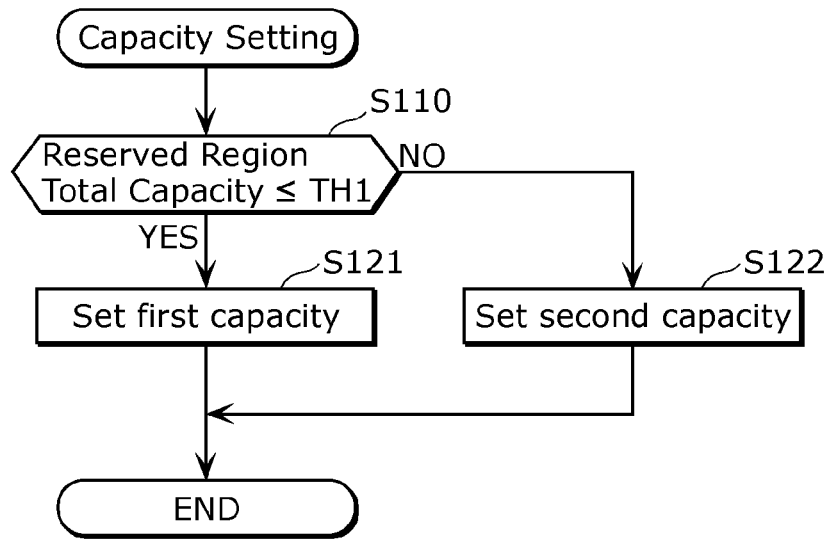
FIG. 4 is a flowchart of capacity setting.

FIG. 4 is a flowchart of the capacity setting.

At Step S110, with reference to FIG. 4, the capacity setting unit 124 determines whether or not the latest reserved region total capacity is no greater than a predetermined first threshold value TH1. The first threshold value TH1 is a half or smaller than a maximum memory capacity of the DRAM 200. In other words, the first threshold value TH1 is a half or smaller than a total capacity of the u memory regions C10 in the DRAM 200.

An example of the first threshold value TH1 is three eighths of the maximum memory capacity of the DRAM 200. Here, the first threshold value TH1 is not limited to three eighths of the maximum memory capacity. The first threshold value TH1 may be a value in a range from two eighths to three eighths of the maximum memory capacity, for example.

In other words, the capacity setting unit 124 determines whether or not predetermined conditions for a reserving state of the memory are satisfied. In this case, the predetermined conditions for the memory reserving state are that the latest reserved region total capacity is no greater than the predetermined first threshold value TH1. More specifically, the predetermined conditions for the memory state are that a total capacity of all of reserved regions indicated by respective pieces of identification information (reserved capacities CP) most recently indicated by the respective segments SG is no greater than the predetermined first threshold value TH1.

When the above-described predetermined conditions are satisfied, in other words, if the reserved region total capacity is no greater than the predetermined first threshold value TH1 (YES at Step S110), then the capacity setting unit 124 performs Step S121.

At Step S121, the capacity setting unit 124 provides the segment setting unit 121 with a first capacity setting instruction to instruct to set a reserved capacity CP of a segment SG to the first capacity.

When the first capacity setting instruction is received, the segment setting unit 121 sets, to the first capacity, the reserved capacity CP of the segment SG selected by the address conversion circuit 110 in the above-described address conversion, until a second capacity setting instruction described later is received.

The power consumption control unit 122 constantly monitors a state of each of the segments SG included in the segment table T10.

When a reserved capacity CP of a segment SG is set to the first capacity, the power consumption control unit 122 transmits, to the DRAM control circuit 210, an access region limiting instruction for limiting a region to be accessed.

When the access region limiting instruction is received, the DRAM control circuit 210 accesses only a region designated by the access region limiting instruction.

Here, for example, the first capacity is assumed to be a capacity of four bank-corresponding regions. In this case, the access region limiting instruction transmitted from the power consumption control unit 122 is an instruction for accessing only bank-corresponding regions corresponding to the banks BK0 to BK3 from among the eight bank-corresponding regions included in the unit region RW. Here, for example, the DRAM control circuit 210 is assumed to receive a memory access request RQA requesting for permission to access the unit region RW[2].

In this case, according to the access region limiting instruction and the memory access request RQA, the DRAM control circuit 210 accesses only bank-corresponding regions corresponding to the banks BK0 to BK3 from among eight bank-corresponding regions included in the unit region RW[2].

In this case, if a unit region RW corresponding to a segment SG set to have the first capacity is accessed according to the above-described memory access request RQA, the DRAM control circuit 210 accesses only a part corresponding to the first capacity from among the unit region RW.

On the other hand, if the reserved region total capacity is larger than the first threshold value TH1 (NO at Step S110), then the capacity setting unit 124 performs Step S122.

At Step S122, the capacity setting unit 124 provides the segment setting unit 121 with a second capacity setting instruction to instruct to set a reserved capacity CP of a segment SG to the second capacity.

When the second capacity setting instruction is received, the segment setting unit 121 sets, to the second capacity, the reserved capacity CP of the segment SG selected by the address conversion circuit 110 in the above-described address conversion, until a first capacity setting instruction is received.

More specifically, Steps S121 and S122 performed by the control unit 120 (the capacity setting unit 124 and the segment setting unit 121) are processing for dynamically determining (setting) banks to be accessed from among the above-described p banks. In other words, the capacity setting performed by the control unit 120 (the capacity setting unit 124 and the segment setting unit 121) is processing for dynamically determining (setting) banks to be accessed from among the above-described p banks. In other words, the capacity setting performed by the control unit 120 is processing for dynamically determining a part to be accessed in the memory (DRAM 200).

The power consumption control unit 122 constantly performs power consumption control using the segment table T10, independently from the other processing. In other words, the power consumption control unit 122 constantly monitors the segment table T10.

Figure 5:
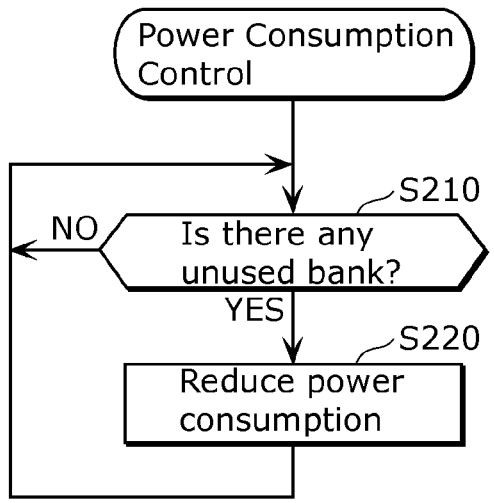
FIG. 5 is a flowchart of power consumption control.

FIG. 5 is a flowchart of the power consumption control.

At Step S210, the power consumption control unit 122 determines, with reference to the latest segment table T10, whether or not there is any unused bank. An unused bank refers to a bank in which all memory regions C10 are not-reserved region. That is, an unused bank is a bank in which all memory regions C10 are not permitted to be accessed. In other words, an unused bank is a bank not determined (set) to be accessed, namely, a bank not to be accessed.

For example, if n memory regions C10 in the bank BK7 in FIG. 2 are not-reserved region, the bank BK7 is an unused bank.

More specifically, the power consumption control unit 122 determines whether or not each of all n reserved capacities CP indicated by the respective n segments SG indicated in the segment table T10 does not indicate the second capacity. The case where all of the n reserved capacities CP do not indicate the second capacity is, for example, the case where each of the n reserved capacities CP is set to the first capacity or 0.

If all of the n reserved capacities CP do not indicate the second capacity, then the power consumption control unit 122 determines that there is an unused bank. On the other hand, if at least one of the n reserved capacities CP indicates the second capacity, then the power consumption control unit 122 determines that there is no unused bank.

If YES at Step S210, then the processing proceeds to Step S220. On the other hand, if No at Step S210, then Step S210 is repeated.

More specifically, for each processing which causes a change in a state of the memory (DRAM 200) and is performed to access the memory, if the predetermined conditions for the memory reserving state are satisfied and there is an unused bank not to be accessed (not permitted to be accessed) from among p banks, the control unit 120 (the power consumption control unit 122) performs the power consumption reduction at Step S220.

The above-described predetermined conditions for the memory reserving state are that the latest reserved region total capacity is no greater than the predetermined first threshold value TH1. More specifically, the predetermined conditions for the memory reserving state are that a total capacity of all of reserved regions indicated by the respective pieces of identification information (reserved capacities CP) most recently indicated by the respective segments SG is no greater than the predetermined first threshold value TH1.

Here, as described previously, the processing, which causes a change in a state of the memory (DRAM 200) and is used to access the memory, is processing which needs segment updating and is used to access a unit region.

At Step S220, the power consumption control unit 122 performs power consumption reduction. In the power consumption reduction, the power consumption control unit 122 transmits, to the DRAM 200 via the DRAM control circuit 210, a self refresh instruction (command) for instructing self refresh processing on unused banks. Then, the power consumption reduction is completed.

According to the received self refresh instruction, the DRAM 200 performs self refresh processing on the unused banks designated by the self refresh instruction. In other words, the DRAM 200 performs partial self refresh processing. In other words, the power consumption reduction is processing performed by the power consumption control unit 122 (the control unit 120) to control the memory (the DRAM 200) to perform self refresh processing on unused banks.

Here, from among the banks BK0 to BK7, banks except the unused banks applied with self refresh processing are applied with the above-described auto refresh processing. It is assumed that a time duration of the self refresh processing is almost equal to a time duration of the auto refresh processing. As described above, a power consumption requirement of the self refresh processing is lower than a power consumption requirement of the auto refresh processing.

Therefore, it is possible to reduce power consumption of unused bank(s), while processing for holding data stored in the DRAM 200 is performed. In other words, the power consumption reduction is processing performed by the power consumption control unit 122 (control unit 120) to control the memory (DRAM 200) to cause power consumption of unused bank(s) to be less than power consumption of the other bank(s) except the unused bank(s).

An unused bank applied with self refresh processing is incapable of being accessed. Therefore, in the logical memory space, an unused bank is considered as being currently used.

Here, the power consumption control unit 122 does not repeat transmission of the self refresh instruction to the DRAM control circuit 210 until a predetermined time duration (for example, one second) has passed since transmission of a previous self refresh instruction, in order to prevent increase of power consumption per unit time (for example, one hour) for the DRAM 200. Then, this power consumption reduction is completed, and Step S210 is repeated.

Next, an example of processing performed by the memory management unit 100 is described.

Figure 6:
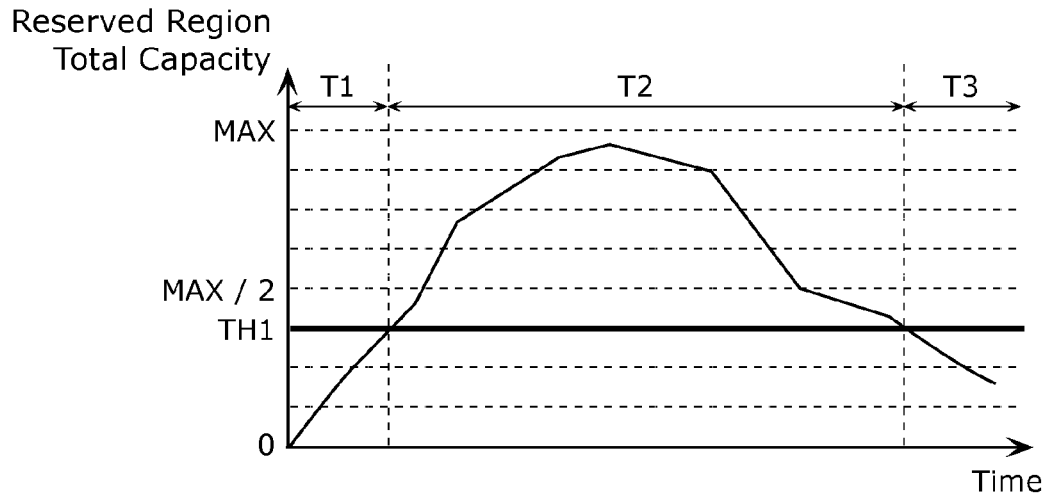
FIG. 6 is a graph for explaining an example of processing performed by a memory management unit.

FIG. 6 is a diagram for explaining an example of the processing performed by the memory management unit 100.

Here, for example, the DRAM 200 corresponding to the memory management unit 100 is assumed to include eight banks. It is assumed in the memory management unit 100 that the above-described capacity monitoring, the capacity setting in FIG. 4, and the power consumption control in FIG. 5 are performed.

Referring to FIG. 6, a vertical axis indicates the above-described reserved region total capacity constantly calculated by the memory capacity monitoring unit 123. In FIG. 6, "MAX" indicates a maximum memory capacity of the DRAM 200. "MAX/2" indicates a capacity of a half of the all memory regions of the DRAM 200. "TH1" indicates the above-described first threshold value TH1. In other words, the first threshold value TH1 is, for example, a value smaller than a half of a total capacity of the u memory regions C10 in the DRAM 200.

Here, every time at least one segment SG becomes effective, the reserved region total capacity is changed.

In a time duration T1, the reserved region total capacity is no larger than one half of the maximum memory capacity. Therefore, it is determined as YES at Step S110 in FIG. 4, and the above-described Step S121 is performed. Therefore, the power consumption control unit 122 transmits, to the DRAM control circuit 210, an access region limiting instruction for limiting a region to be accessed.

When the access region limiting instruction is received, the DRAM control circuit 210 accesses only a region designated by the access region limiting instruction. Here, for example, the access region limiting instruction is an instruction for accessing only bank-corresponding regions corresponding to the banks BK0 to BK3 from among the unit region RW.

In this case, in the power consumption control in FIG. 5, it is determined that there is any unused bank (banks BK4 to BK7) (YES at Step S210), and the power consumption reduction at Step S220 is performed.

By the power consumption reduction, the DRAM 200 performs self refresh processing on the banks BK4 to BK7. Therefore, it is possible to reduce power consumption of the unused banks, while processing for holding data stored in the DRAM 200 is performed.

Figure 7:
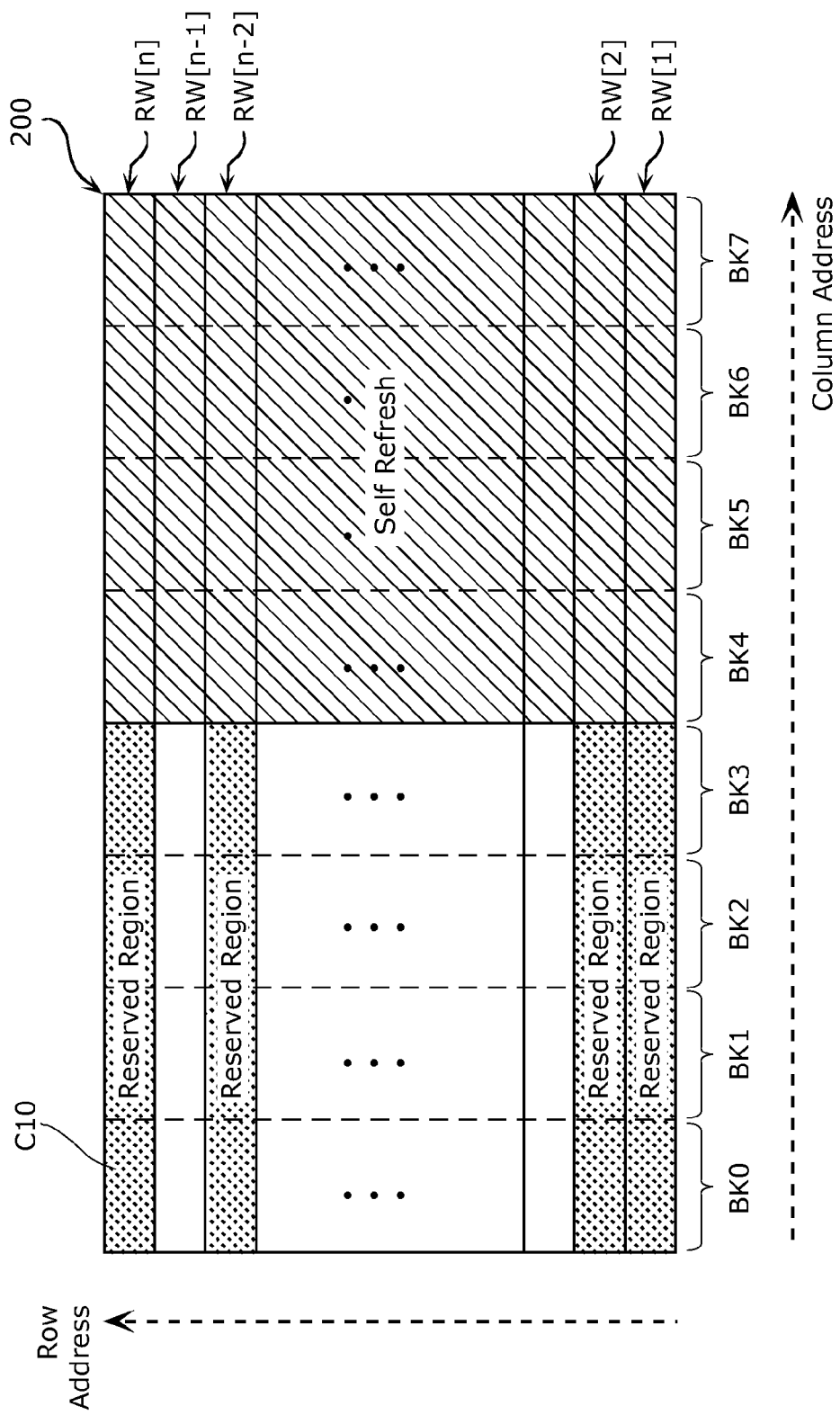
FIG. 7 is a diagram for showing an example of a state of a DRAM.

FIG. 7 is a diagram for showing an example of a state of the DRAM 200 during the time duration T1.

In FIG. 7, the reserved region will not be explained again in detail, because it has already been described.

As described previously, an unused bank applied with self refresh processing is incapable of being accessed. Therefore, in the logical memory space, an unused bank is considered as being currently used.

Here, for example, it is assumed that the DRAM 200 performs eight bank interleaving, and a reserved capacity CP of a segment SG is set to a capacity of eight bank-corresponding regions. In this case, if the DRAM 200 attempts to perform four bank interleaving, it is necessary to use two segments. Therefore, in the logical memory space, a capacity in four bank interleaving, which is not an actual reserved capacity, seems twice as large as a capacity in eight bank interleaving.

The following describes times of switching, by the capacity setting unit 124, a reserved capacity CP reserved by a segment.

As described above, when the reserved region total capacity is no greater than the first threshold value TH1 and there is any unused bank, self refresh processing is performed.

On the other hand, if the reserved region total capacity becomes larger than the first threshold value TH1 immediately after the time duration T1 as shown in FIG. 6, the capacity setting unit 124 sets a reserved capacity CP reserved by a segment that is to be effective next is set to the above-described second capacity (unit region maximum capacity). Here, the segment to be effective next is a segment SG that is not effective and is positioned next to the latest segment SG processed by the capacity setting unit 124.

At the same time, the power consumption control unit 122 transmits, to the DRAM 200 via the DRAM control circuit 210, a self refresh stop instruction (command) for stopping execution of self refresh processing.

According to the self refresh stop instruction, the DRAM 200 stops execution of self refresh processing. In other words, execution of partial self refresh processing is stopped. As a result, the banks BK0 to BK7 in the DRAM 200 become available.

In a time duration T2, by the above-described processing of the segment setting unit 121, a reserved capacity CP reserved by a segment SG that is to be newly effective is set to the second capacity (unit region maximum capacity). As a result, access to the DRAM 200 becomes access by eight bank interleaving.

Figure 8:
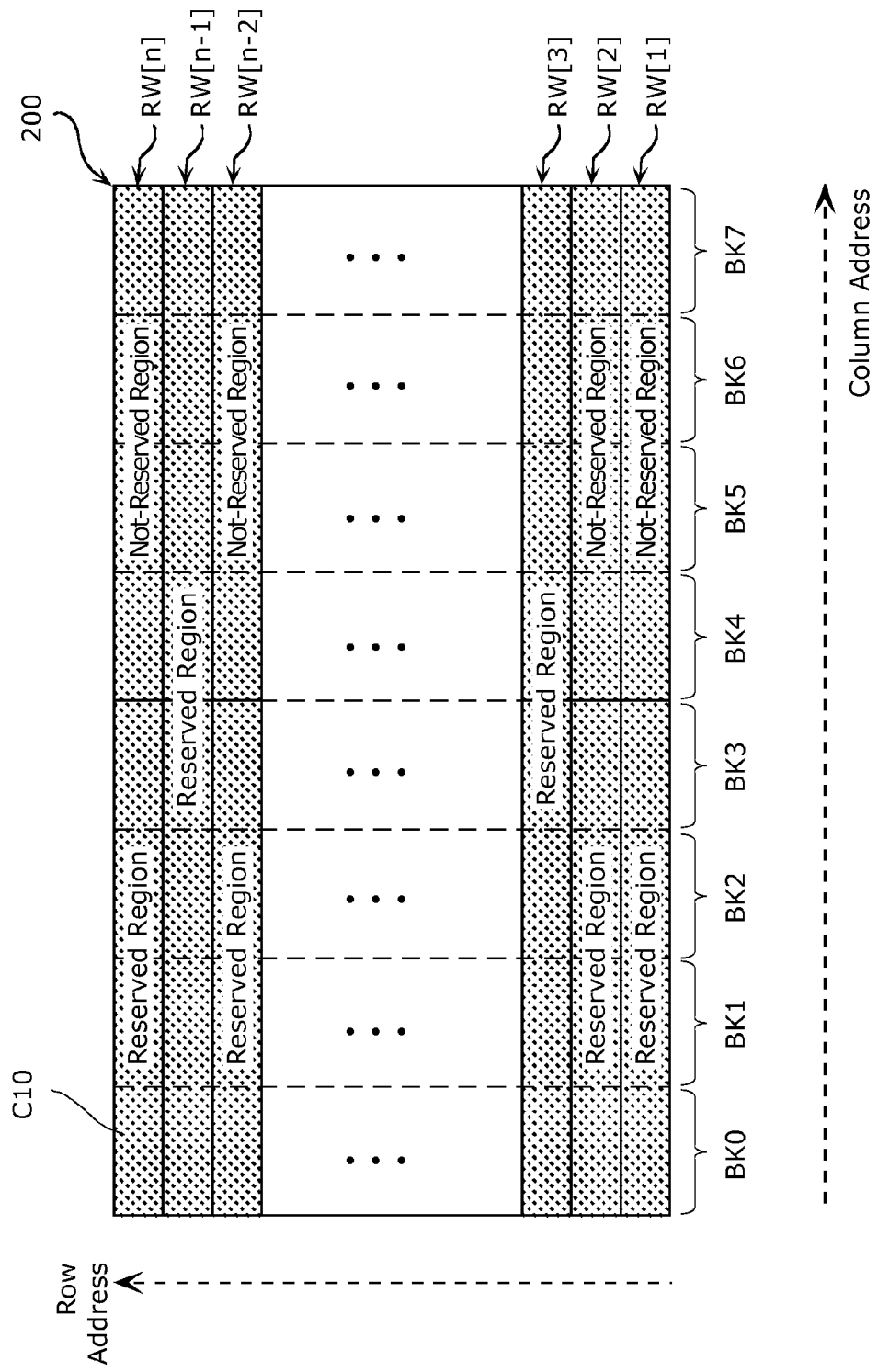
FIG. 8 is a diagram for showing an example of a state of a DRAM.

FIG. 8 is a diagram for showing an example of a state of the DRAM 200 during the time duration T2.

In FIG. 8, a reserved region and a not-reserved region will not be explained again in detail, because they have already been described.

In FIG. 8, for the unit region RW[1], all of the four bank-corresponding regions are reserved regions. In other words, four bank interleaving is performed on the unit region RW[1]. Furthermore, for the unit region RW[3], all of the eight bank-corresponding regions are reserved regions. In other words, eight bank interleaving is performed on the unit region RW[3].

In other words, in the time duration T2, the DRAM 200 performs processing on both (a) the unit region RW[1] for which four bank interleaving is performed and (b) the unit region RW[3] for which eight bank interleaving is performed.

In this case, in the unit region RW[1] for which four bank interleaving is performed, four not-reserved regions corresponding to the banks BK4 to BK7 are still incapable of being used.

In the time duration T2 in FIG. 6, when the processing for four bank interleaving on the unit region RW[1] (processing corresponding to an memory access request) is completed, the unit region RW[1] is released. More specifically, the segment setting unit 121 sets the segment SG corresponding to the unit region RW[1] to be not effective.

Then, in the time duration T2, if there is a memory access request for using the unit region RW[1] again, the segment setting unit 121 sets the segment SG corresponding to the unit region RW[1] to be effective, and sets a reserved capacity CP of the segment SG to the second capacity (unit region maximum capacity). Thereby, the unit region RW[1] can perform eight bank interleaving.

In FIG. 6, a time duration T3 is a time duration during which the reserved region total capacity is no greater than the first threshold value TH1. More specifically, regarding the time duration T2 during which the reserved region total capacity is larger than the first threshold value TH1, if the reserved region total capacity becomes no greater than the first threshold value TH1, the time duration T2 is changed to the time duration T3. In other words, like the transition from the time duration T1 to the time duration T2, the transition from the time duration T2 to the time duration T3 uses the first threshold value TH1.

If the reserved region total capacity becomes no greater than the first threshold value TH1, the capacity setting unit 124 sets, in the above-described capacity setting in FIG. 4, the reserved capacity CP reserved by a segment to be effective next to the first capacity (one half of the unit region maximum capacity). More specifically, a unit region RW corresponding to a segment having a reserved capacity CP set to the first capacity can perform four bank interleaving.

In this case, in the four bank-corresponding regions corresponding to the banks BK0 to BK3, the power consumption control unit 122 transmits an instruction for interleaving to the DRAM control circuit 210. More specifically, as described above, the power consumption control unit 122 transmits, to the DRAM control circuit 210, an access region limiting instruction for limiting a region to be accessed.

Furthermore, when there is no unit region RW for which eight bank interleaving is to be performed, the power consumption control unit 122 transmits a self refresh instruction to the DRAM 200 via the DRAM control circuit 210. Therefore, Step S220 in FIG. 5 is performed.

As described above, according to the present embodiment, in a time duration where access by bank interleaving is performed, a reserved region total capacity is calculated constantly by using a segment SG, and a reserved capacity CP reserved by the segment is changed according to the reserved region total capacity.

In other words, for each unit region RW, the number of bank-corresponding regions for which interleaving is to be performed is changed, and if there is an unused bank, self refresh processing is performed on the unused bank. Therefore, it is possible to efficiently reduce power consumption of the DRAM 200, without decreasing data transmission efficiency in access using bank interleaving.

More specifically, if a reserved region total capacity is no greater than the first threshold value TH1, a capacity reserved by a segment SG is reduced. In other words, the number of bank-corresponding regions to be accessed by bank interleaving is decreased. This causes unused bank(s). Then, self refresh processing is performed on the unused bank(s). As a result, it is possible to efficiently reduce power consumption of the DRAM 200.

More specifically, according to the present embodiment, in a memory which is to be accessed by bank interleaving, for each processing which causes a change in the memory reserving state, the power consumption reduction is performed to control a memory to cause power consumption of unused bank(s) to be less than power consumption of bank(s) except the unused bank(s), if predetermined conditions for the memory reserving state are satisfied (YES at S110) and there is any unused bank.

As a result, when the memory reserving state is changed, if the predetermined conditions for the memory reserving state are satisfied and there is any unused bank, it is possible to reduce power consumption of the unused bank.

Therefore, it is possible to reduce power consumption of the unused bank which results form the change in the reserving state of the memory which is to be accessed by bank interleaving. As a result, it is possible to efficiently reduce power consumption of the memory according to the change in the memory reserving state.

Although the reserved region total capacity is used in the present embodiment, the present invention is not limited to the above. It is possible to dynamically change the number of bank-corresponding regions for which interleaving is to be performed, according to the above-described capacity reservation rate that is a ratio of the reserved region total capacity to the maximum memory capacity.

Although partial self refresh processing is used to reduce power consumption of the DRAM 200 in the present embodiment, the present invention is not limited to the above. For example, it is also possible to stop power supply to the above-described not-reserved region, thereby reducing power consumption of the DRAM 200.

(Embodiment 2)

In Embodiment 2, the description is given for a structure in which the capacity setting unit 124 performs processing for setting a reserved capacity CP based on two elements. The two elements are the above-described reserved region total capacity and the number of effective segments. The number of effective segments is the number of segments SG each having effectiveness determination information FG indicating "effective".

Figure 9:
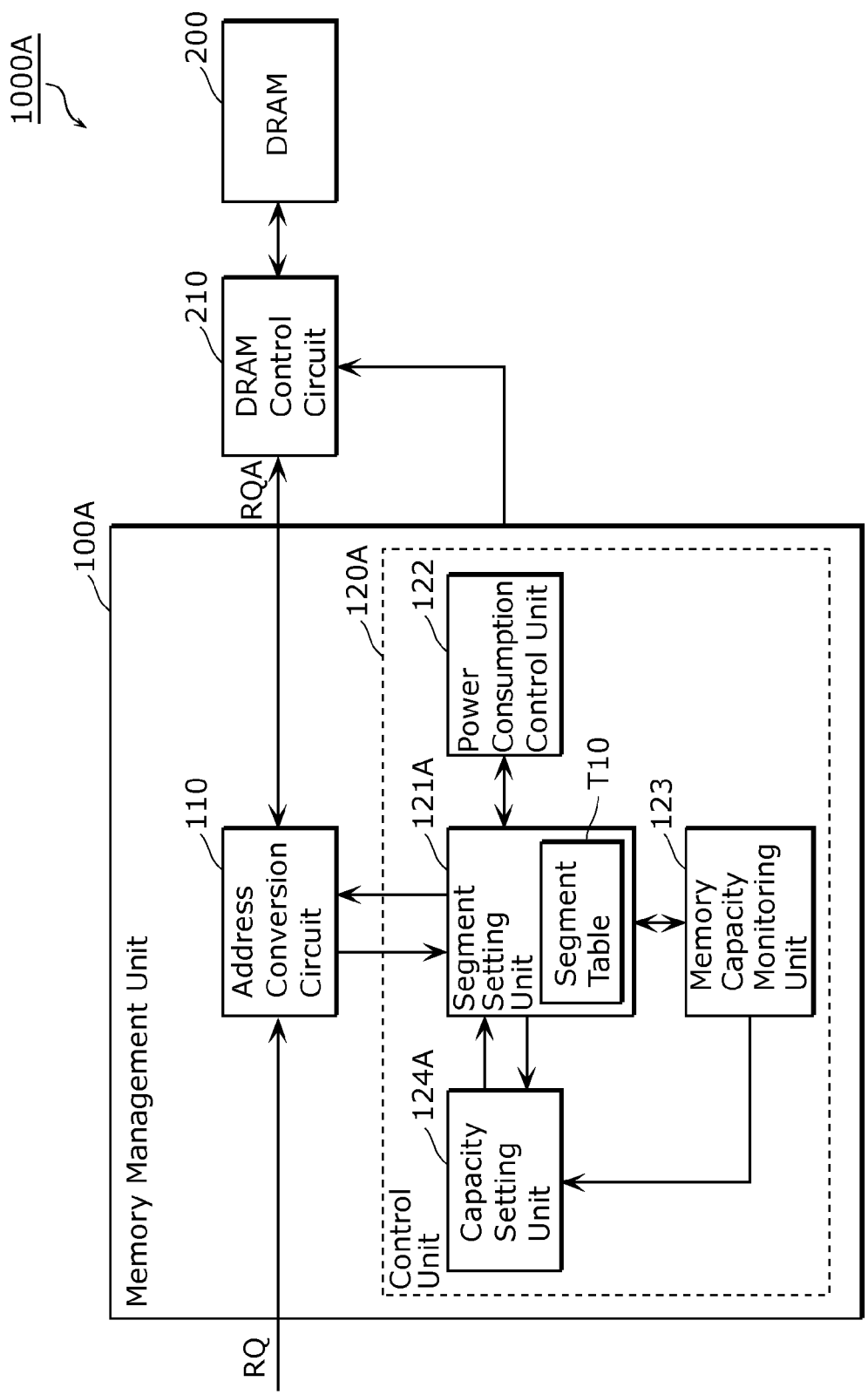
FIG. 9 is a block diagram showing a structure of a data storage device according to Embodiment 2.

FIG. 9 is a block diagram showing a structure of a data storage device 1000A according to Embodiment 2.

With reference to FIG. 9, the data storage device 1000A differs from the data storage device 1000 in FIG. 1 that a memory management unit 100A is included instead of the memory management unit 100. The other structure in the data storage device 1000A is the same as the structure of the data storage device 1000, so that it will not be described repeatedly.

The memory management unit 100A differs from the memory management unit 100 in FIG. 1 in that a control unit 120A is included instead of the control unit 120. The other structure in the memory management unit 100A is the same as the structure of the memory management unit 100, so that it will not be described repeatedly.

The control unit 120A differs from the control unit 120 in FIG. 1 in that a segment setting unit 121A is included instead of the segment setting unit 121 and that a capacity setting unit 124A is included instead of the capacity setting unit 124. The other structure in the control unit 120A is the same as the structure of the control unit 120, so that it will not be described repeatedly.

The segment setting unit 121A has the same structure as the structure of the segment setting unit 121. This means that the segment setting unit 121A has the segment table T10.

The segment setting unit 121A performs the same processing as the processing of the segment setting unit 121. This means that, every time address conversion is performed, the segment setting unit 121A updates effectiveness determination information FG as needed and also updates its segment SG, in the same manner as described for the segment setting unit 121.

Therefore, for each processing which requires to update a segment and is performs to access an unit region, the segment setting unit 121A updates at least one of (a) identification information indicated in the segment to be updated and (b) effectiveness determination information indicated by the segment to be updated. Here, the processing, which needs segment updating and is used to access an unit region, is the above-described address conversion using the memory access request RQ that requires updating of the segment.

In other words, the processing, which needs segment updating and is used to access an unit region, is processing which changes a state of the memory (DRAM 200) and is used to access the memory (DRAM 200).

The processing performed by the segment setting unit 121A to update at least one of (a) identification information indicated in a segment to be updated and (b) effectiveness determination information indicated by the segment to be updated is processing for dynamically determining (setting) a bank to be accessed from among p banks.

Furthermore, every time the number of effective segments included in the segment table T10, the segment setting unit 121A also notifies the number of effective segments to the capacity setting unit 124A. As a result, the capacity setting unit 124A always knows the number of effective segments.

It is also possible to notify a ratio of effective segments, not the number of effective segments, to the capacity setting unit 124A. The ratio of effective segment is a ratio of (a) the number of effective segments to (b) a total number of segments SG.

The memory capacity monitoring unit 123 performs capacity monitoring in the same manner as described in Embodiment 1. More specifically, the memory capacity monitoring unit 123 calculates a reserved region total capacity, and every time the reserved region total capacity is calculated, notifies the reserved region total capacity to the capacity setting unit 124A.

Therefore, the capacity setting unit 124A is constantly notified of the reserved region total capacity from the memory capacity monitoring unit 123. Therefore, the capacity setting unit 124A always knows the reserved region total capacity.

According to the present embodiment, every time the memory capacity monitoring unit 123 notifies a reserved region total capacity to the capacity setting unit 124A, capacity setting A is performed.

Figure 10:
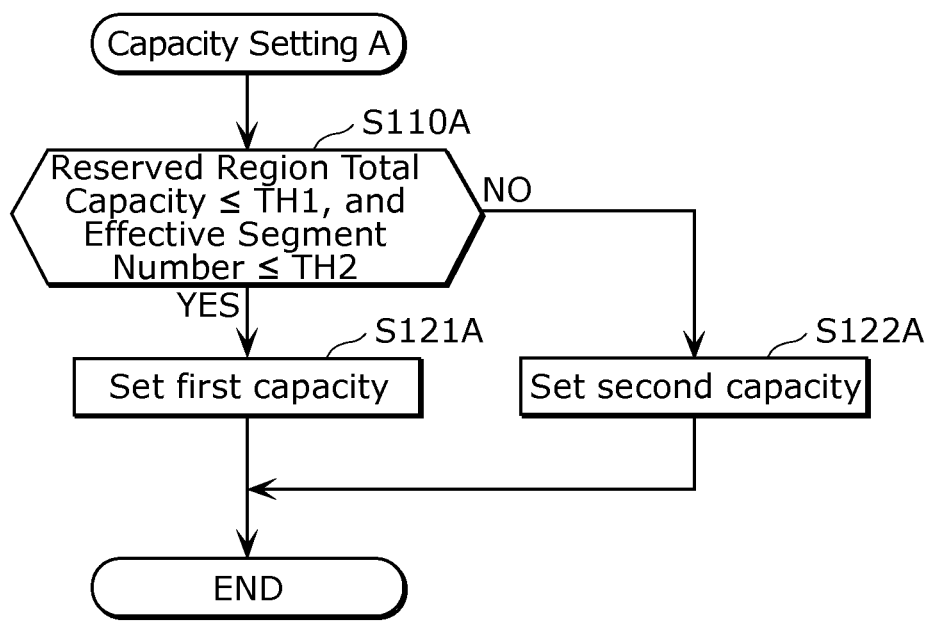
FIG. 10 is a flowchart of capacity setting A.

FIG. 10 is a flowchart of the capacity setting A.

Referring to FIG. 10, at Step S110A, the capacity setting unit 124A determines whether or not the latest reserved region total capacity is no greater than the predetermined first threshold value TH1 and the latest total number of effective segment is no greater than a predetermined second threshold value TH2. As described earlier, the first threshold value TH1 is a value smaller than a half of a total capacity (maximum memory capacity) of the u memory regions C10 of the DRAM 200. The second threshold value TH2 is a value that is smaller than n/2.

In other words, the capacity setting unit 124A determines whether or not the predetermined conditions for the memory reserving state are satisfied. In this case, the predetermined conditions for the memory reserving state are that a total capacity of all reserved regions identified by the pieces of identification information (reserved capacities CP) most recently indicated by the respective segments SG is no greater than the predetermined first threshold value TH1, and the number of effective segments is no greater than the predetermined second threshold value TH2.

Here, if the first threshold value TH1 is a value smaller than a half of the maximum memory capacity of the DRAM 200, the second threshold value TH2 may be a value other than the value that is smaller than n/2. For example, the second threshold value TH2 may be a value satisfying a relationship formula of $n/2 \leq TH2 \leq 3/4$.

Here, if the second threshold value TH2 is smaller than n/2, the first threshold value TH1 may be a value other than the value that is smaller than a half of the maximum memory capacity of the DRAM 200. The first threshold value TH1 may be, for example, a value that is equal to or greater than a half of the maximum memory capacity, and is in a range smaller than the maximum memory capacity.

If YES at Step S110A, the processing proceeds to Step S121A. On the other hand, if No at Step S110A, the processing proceeds to Step S122A.

At Step S121A, the same processing as Step S121 is performed, so that it will not be described again in detail. That is, the capacity setting unit 124A provides the segment setting unit 121A with a first capacity setting instruction to instruct to set a reserved capacity CP of a segment SG to the first capacity.

When the first capacity setting instruction is received, the segment setting unit 121A sets, to the first capacity, the reserved capacity CP of the segment SG selected by the address conversion circuit 110 in the above-described address conversion, until a second capacity setting instruction is received.

At Step S122A, the same processing as Step S122 is performed, so that it will no be described in detail. That is, the capacity setting unit 124A provides the segment setting unit 121A with a second capacity setting instruction to instruct to set a reserved capacity CP of a segment SG to the second capacity.

When the second capacity setting instruction is received, the segment setting unit 121A sets, to the second capacity, the reserved capacity CP of the segment SG selected by the address conversion circuit 110 in the above-described address conversion, until a first capacity setting instruction is received.

More specifically, Steps S121A and S122A performed by the control unit 120A (the capacity setting unit 124A and the segment setting unit 121A) are processing for dynamically determining (setting) banks to be accessed from among the above-described p banks. In other words, the capacity setting A performed by the control unit 120A (the capacity setting unit 124A and the segment setting unit 121A) is processing for dynamically determining (setting) banks to be accessed from among the above-described p banks. In other words, the capacity setting A performed by the control unit 120A is processing for dynamically determining a part to be accessed in the memory (DRAM 200).

The power consumption control unit 122 performs the above-described power consumption control shown in FIG. 5.

Next, an example of processing performed by the memory management unit 100A is described.

Figure 11:
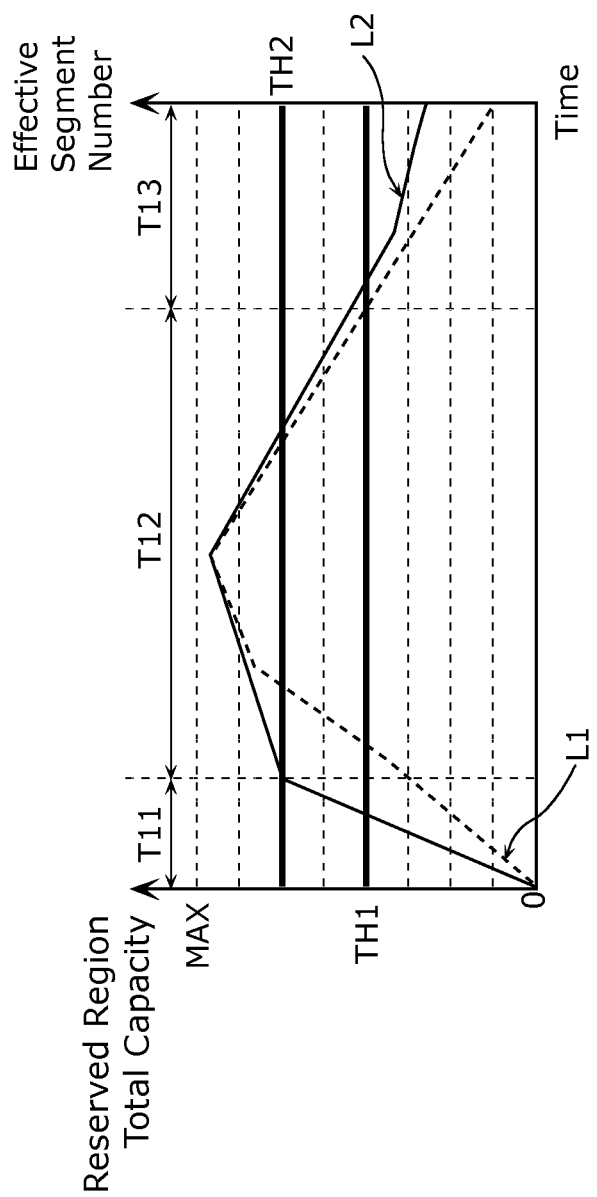
FIG. 11 is a graph for explaining an example of processing performed by a memory management unit.

FIG. 11 is a diagram for explaining an example of the processing performed by the memory management unit 100A. Here, for example, the DRAM 200 corresponding to the memory management unit 100A is assumed to include eight banks. It is assumed in the memory management unit 100A that the above-described capacity monitoring, the capacity setting A in FIG. 10, and the power consumption control in FIG. 5 are performed.

In FIG. 11, the same terms in FIG. 6 has already explained and therefore will be not described in detail. In FIG. 11, a left vertical axis indicates a reserved region total capacity, and a right vertical axis indicates the number of effective segments. "TH2" is the second threshold value TH2.

In FIG. 11, a characteristic line L1 indicates changes in the reserved region total capacity over time. A characteristic line L2 indicates changes in the number of effective segments over time.

It is assumed that the DRAM 200 performs four bank interleaving when the memory management unit 100A starts processing.

In the time duration T11, the reserved region total capacity is no greater than the first threshold value TH1, and the number of effective segments is no greater than the second threshold value TH2. Therefore, in the time duration T11, the capacity setting unit 124A performs processing for setting the reserved capacity CP reserved by the segment to the second capacity. In other words, in the time duration T11, the segment setting unit 121A sets the reserved capacity CP of the segment SG to be set to the first capacity (a half of the unit region maximum capacity).

In the time duration T11, like the time duration T1 in FIG. 6, the power consumption reduction is performed by the power consumption control in FIG. 5. In other words, partial self refresh processing is performed.

At the beginning (early stage of the time duration) of the time duration T12, the reserved region total capacity is no greater than the first threshold value TH1, but the number of effective segments is greater than the second threshold value TH2.

Therefore, it is determined as NO at Step S110A in FIG. 10, and then the capacity setting unit 124A performs Step S122A. At Step S122A, the capacity setting unit 124A sets the reserved capacity CP reserved by the segment to be effective next to the above-described second capacity (unit region maximum capacity). In this case, the unit region RW corresponding to the segment SG set to the second capacity performs eight bank interleaving.

At the end (final stage of the time duration) of the time duration T12, the number of effective segments is no greater than the second threshold value TH2, but the reserved region total capacity is greater than the first threshold value TH1. Therefore, it is determined as NO at Step S110A in FIG. 10, and then the capacity setting unit 124A performs Step S122A. In other words, at the end (final stage of the time duration) of the time duration T12, the segment setting unit 121A sets the reserved capacity CP of the segment SG to be set to the second capacity (the unit region maximum capacity).

In the time duration T12, the same processing as performed in the time duration T2 in FIG. 6 is performed, thereby stopping execution of the self refresh processing.

In the time duration T13, the reserved region total capacity is no greater than the first threshold value TH1, and the number of effective segments is no greater than the second threshold value TH2. Therefore, in the time duration T13, the capacity setting unit 124A performs processing for setting the reserved capacity CP reserved by the segment to the second capacity. In other words, in the time duration T13, the segment setting unit 121A sets the reserved capacity CP of the segment SG to be set to the first capacity (a half of the unit region maximum capacity).

In the time duration T13, like the time duration T3 in FIG. 6, the power consumption reduction is performed by the power consumption control in FIG. 5. Therefore, partial self refresh processing is performed.

Here, the segment setting unit 121A, the power consumption control unit 122, the memory capacity monitoring unit 123, and the like except the capacity setting unit 124A performs the respective processings as described in Embodiment 1.

As described above, according to the present embodiment, it is determined, based on two elements that are the reserved region total capacity and the number of effective segments, whether or not self refresh processing is performed on an unused bank of the DRAM 200. Therefore, it is possible to control the state of the power consumption of the DRAM 200 more accurately than Embodiment 1. Therefore, it is possible to efficiently reduce the power consumption of the DRAM 200, without decreasing data transmission efficiency in access by bank interleaving.

Therefore, the present embodiment can also produce the same effects as described in Embodiment 1. In other words, it is possible to reduce the power consumption of unused bank(s) which results from changes in the reserving state of the memory which is to be accessed by bank interleaving. As a result, it is possible to efficiently reduce the power consumption of the memory according to change in the memory reserving state.

It is also possible to prevent the state where the reserved capacity CP of the segment SG cannot be set, although there is a memory region C10 capable of storing data. The state would occur in a time duration where both four bank interleaving and eight bank interleaving are performed.

It should be noted that the number of effective segments is used in the present embodiment, but the present invention is not limited to the above. It is possible to perform processing based on the above-described effective segment rate instead of the number of effective segments.

Furthermore, the element used as reference for switching a value set for the reserved capacity CP is not limited to the reserved region total capacity, the capacity reservation rate, the number of effective segments, the effective segment rate, and the like, but may be other element.

(Embodiment 3)

In the present embodiment, the image processing device including the data storage device 1000 or the data storage device 1000A is described. In the present embodiment, for example, the image processing device including the data storage device 1000 is described.

Figure 12:
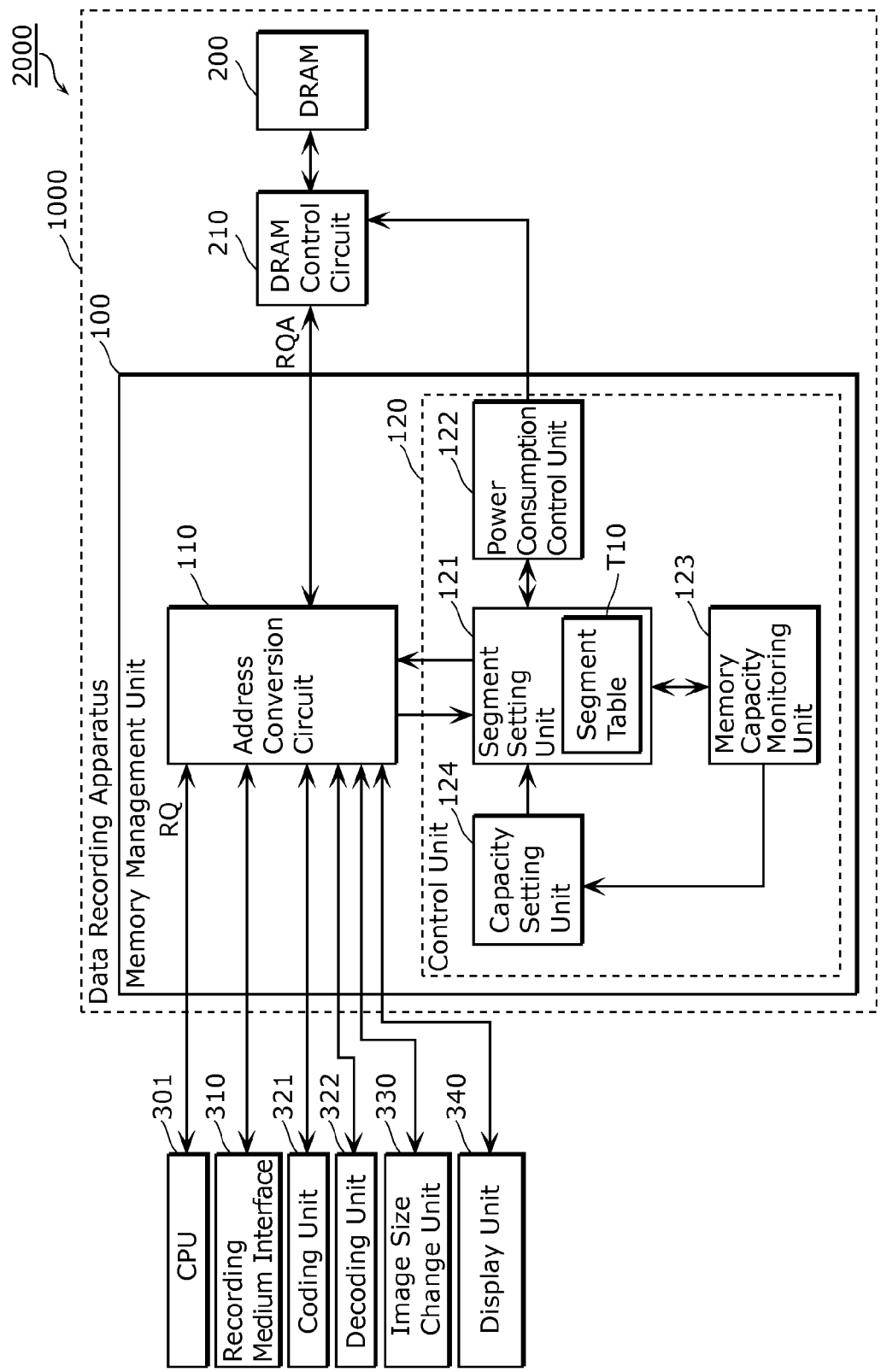
FIG. 12 is a block diagram showing a structure of an image processing device according to Embodiment 3.

FIG. 12 is a block diagram showing a structure of the image processing device 200 according to Embodiment 3. The image processing device 200 is, for example, an imaging device. The imaging device is, for example, a network camera, an in-vehicle camera, a digital camcorder, or a digital still camera, or the like.

With reference to FIG. 12, the image processing device 2000 includes the data storage device 1000, a CPU 301, a recording medium interface 310, a coding unit 321, a decoding unit 322, an image size conversion unit 330, and a display unit 340.

The processing units included in the data storage device 1000 have already been described in Embodiment 1, so that they will not be described again in detail. Here, it is assumed that the DRAM 200 includes eight banks, for example.

The CPU 301 controls the memory management unit 100. In addition, the CPU 301 transmits the above-described memory access request RQ to the address conversion circuit 110. Here, the CPU 301 can communicate with the recording medium interface 310.

The recording medium interface 310 is connected to the recording medium (not shown).

The coding unit 321 codes image. The decoding unit 322 decodes the coded image data. The image size conversion unit 330 increases and decreases the size of the image.

The display unit 340 is a display device that displays image. The display unit 340 may be a device that transmits image data to an external display device. Therefore, the display unit 340 may be a device that controls the external display device.

In the present embodiment, reproducing of image is described. The image is, for example, an image according to Joint Photographic Experts Group (JPEG) standard.

It is assumed that image data coded by JPEG is recorded on a recording medium (not shown). The image data is assumed to be data of captured image.

In the image reproducing, the CPU 301 reads image data from the recording medium via the recording medium interface 310. Then, the CPU 301 performs processing for storing the image data to the DRAM 200, by using the memory management unit 100.

The decoding unit 322 reads the image data from the DRAM 200 by using the memory management unit 100, and decodes the image data to obtain YC data indicating image. The YC data is data including Y (luminance) data and C (chrominance) data.

By using the memory management unit 100, the decoding unit 322 performs processing for storing YC data into a region of the DRAM 200 rather than the region in which image data is stored.

The image size conversion unit 330 reads YC data from the DRAM 200 by using the memory management unit 100. Then, the image size conversion unit 330 increases or decreases size of the image indicated by the YC data. Hereinafter, the YC data indicating the image having the size increased or decreased by the image size conversion unit 330 is referred to also as "converted YC data".

Then, by using the memory management unit 100, the image size conversion unit 330 performs processing for storing the converted YC data into a region of the DRAM 200 rather than the region in which the image data and the YC data are stored.

The CPU 301 reads, from the DRAM 200, the YC data to be displayed, and transmits the YC data to the display unit 340.

The display unit 340 displays the image indicated by the received YC data. Hereinafter, the processing performed by the display unit 340 to display the image indicated by the YC data is referred to also as "image display processing".

By the above-described image reproducing, it is possible to reproduce captured image.

Figure 13:
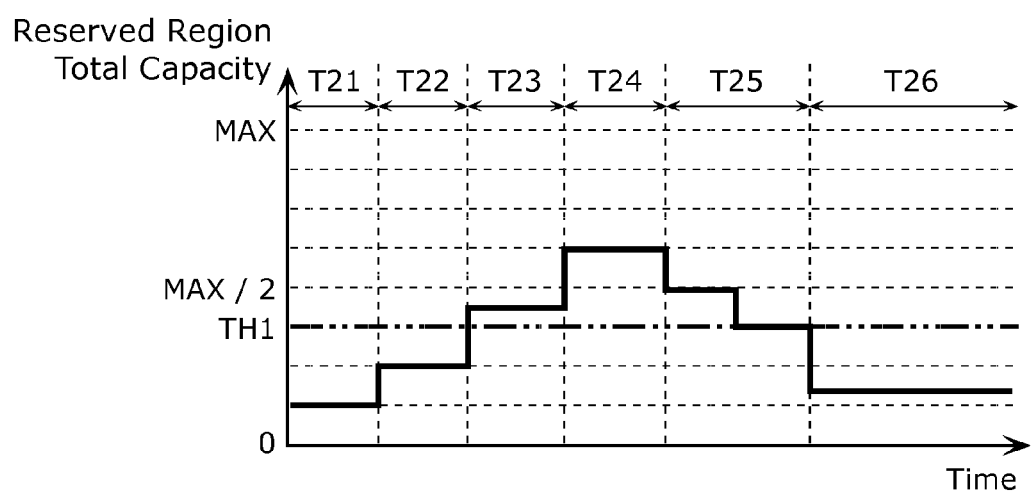
FIG. 13 is a graph showing changes in a reserved region total capacity which is caused by image reproducing.

FIG. 13 is a diagram showing changes in the reserved region total capacity by the image reproducing.

With reference to FIG. 13, in the time duration T21, (a) the processing performed by the CPU 301 to store the image data read from the recording medium to the DRAM 200 at the start of the image reproducing and (b) the processing performed by the decoding unit 322 to read the image data from the DRAM 200 are performed. Hereinafter, the processing performed by the CPU 301 to store image data to the DRAM 200 is referred to as "image data storing".

At the start of the image reproducing, the data to be processed is image data only, and the reserved region total capacity is one eighths of the maximum memory capacity. Therefore, the power consumption control unit 122 transmits, to the DRAM control circuit 210, an access region limiting instruction for instructing to access only bank-corresponding regions corresponding to the banks BK0 to BK3. Therefore, the DRAM 200 performs four bank interleaving.

Here, the banks BK4 to BK7 are unused banks. Therefore, by the power consumption reduction in FIG. 5, the DRAM 200 performs self refresh processing on the banks BK4 to BK7. In other words, the DRAM 200 performs partial self refresh processing. It is thereby possible to reduce power consumption of the unused banks.

In the time duration T22, while image data is already stored in the DRAM 200, the decoding unit 322 further stores the YC data obtained by the decoding into the DRAM 200. Therefore, the reserved region total capacity in the time duration T22 is larger than the reserved region total capacity in the time duration T21. However, the reserved region total capacity in the time duration T22 is no greater than the first threshold value TH1. Therefore, in the time duration T22, like the time duration T21, the DRAM 200 performs four bank interleaving.

In the time duration T23, the image size conversion unit 330 stores the YC data having the converted size into the DRAM 200. In the time duration T23, the reserved region total capacity is greater than the first threshold value TH1. Immediately after the transition from the time duration T22 to the time duration T23, the capacity setting unit 124A sets the reserved capacity CP reserved by the segment to be effective next to the above-described second capacity (unit region maximum capacity).

At the same time, the power consumption control unit 122 transmits, to the DRAM 200 via the DRAM control circuit 210, a self refresh stop instruction (command) for stopping execution of self refresh processing.

According to the self refresh stop instruction, the DRAM 200 stops execution of self refresh processing. In other words, execution of partial self refresh processing is stopped. As a result, the banks BK0 to BK7 in the DRAM 200 become usable.

In the time duration T24, a plurality of processings for displaying YC data to be reproduced are performed.

Hereinafter, the processing performed by the above-described decoding unit 322 to store the YC data is referred to as "YC data storing". Hereinafter, the processing performed by the image size conversion unit 330 to read the YC data from the DRAM 200 is referred to as "YC data reading". Furthermore, the processing performed by the image size conversion unit 330 to store the converted YC data into the DRAM 200 is referred to as the "converted YC data storing". Moreover, the processing performed by the CPU 301 to read YC data to be displayed is referred to as "to-be-displayed YC data reading".

In the time duration T24, the YC data storing, the YC data reading, the converted YC data storing, the to-be-displayed YC data reading, and the previously-described image displaying are performed.

In the time duration T24, like in the time duration T23, the reserved region total capacity is greater than the first threshold value TH1. Therefore, the time duration T24 is a time duration in which the DRAM 200 can perform eight bank interleaving.

By the time duration T25, the above-described image data storing and the above-described YC data storing have already been completed. In the time duration T25, the converted YC data storing and the to-be-displayed YC data reading are performed. In the time duration T25, the reserved region total capacity is greater than the first threshold value TH1. Therefore, like the time duration T24, the time duration T25 is a time duration in which the DRAM 200 can perform eight bank interleaving.

By the time duration T26, the converted YC data storing has already been completed. In the time duration T26, only the above-described to-be-displayed YC data reading and the image displaying are performed. In the time duration T26, since the reserved region total capacity is no greater than the first threshold value TH1, the DRAM 200 can perform four bank interleaving.

However, the to-be-displayed YC data reading is performed by eight bank interleaving. Therefore, in the situation, it is impossible to perform partial self refresh processing on the banks BK4 to BK7.

Then, by using Direct Memory Access (DMA), from among Y data and C data included in the YC data to be displayed, the pieces of data used in the banks BK4 to BK7 are transferred to empty banks BK0 to BK3. Therefore, during the DMA transfer, pieces of data are read from the eight banks. Then, then after completion of the DMA transfer, a current segment is changed to another, and two pieces of data are read from four banks.

Thereby, partial self refresh processing is performed on the banks BK4 to BK7. Here, it is necessary to set the reserved capacity CP reserved by the segment to the first capacity (a half of the maximum memory capacity), and double the number of used segments.

The above-described JPEG image reproducing is processing of displaying decoded image data. In the above-described image reproducing, the to-be-displayed YC data reading occupies the most of the time of the reproducing. As a result, it is possible to efficiently reduce the power consumption of the DRAM 200.

The memory management unit 100 in the above-described image processing device 2000 uses the DRAM 200 as an external memory. In this case, the memory management unit 100 often uses a most part of the external memory as a work memory.

For example, the above-described image processing device 2000 (for example, a camera) repeats processing of reserving a one-frame memory region to previously store image data to be processed, and releasing the memory region after processing the image data. Therefore, in the above-described image processing device 2000, the reserved region total capacity of the memory is constantly changed to be increased or decreased. Therefore, in the image reproducing performed by the image processing device 2000, the present invention has advantages.

The image processing device 2000 may include a data storage device 1000A instead of the data storage device 1000. In this case, the above-described image reproducing is performed using the memory management unit 100A. The image reproducing performed by using the memory management unit 100A is the same as the image reproducing as described with reference to FIGS. 12 and 13. Therefore, it will not be described again in detail.

(Functional Block Diagram)

Figure 14:
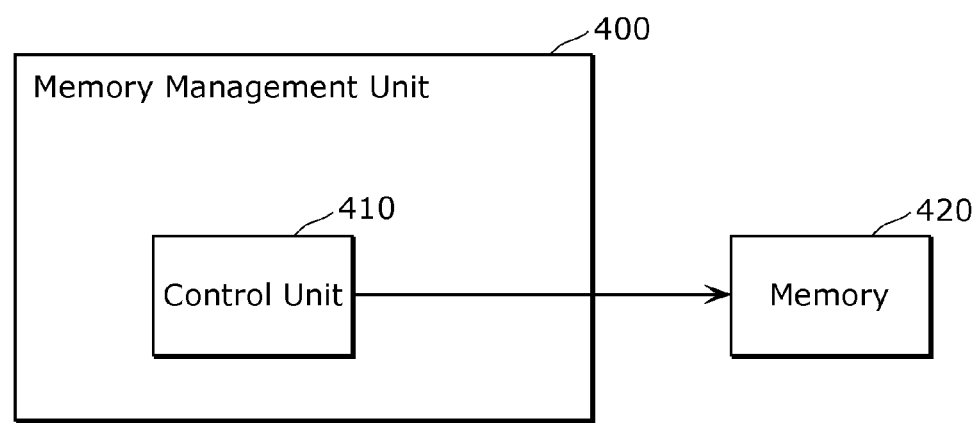
FIG. 14 is a block diagram showing a characterized functional structure of a memory management unit.

FIG. 14 is a block diagram showing a characterized functional structure of the memory management unit 400. The memory management unit 400 corresponds to the memory management unit 100 or the memory management unit 100A. In other words, FIG. 14 is a block diagram showing main functions related to the present invention from among the functions of the memory management unit 100 or the memory management unit 100A. FIG. 14 also shows a memory 420 for explanation.

The memory 420 is a memory which is to be accessed by bank interleaving. The memory 420 includes p banks (where p is an integer of 2 or greater). The memory 420 corresponds to the DRAM 200.

The memory management unit 400 manages the state of the memory 420.

The memory management unit 400 functionally includes the control unit 410.

The control unit 410 performs processing for dynamically determining a bank(s) to be accessed from among the p banks in the memory 420.

Furthermore, when predetermined conditions for a reserving state of the memory 420 are satisfied and there is any unused bank not to be accessed from among the p banks, the control unit 410 performs power consumption reduction to control the memory to cause power consumption of the unused bank(s) to be less than power consumption of other banks except the unused bank(s). The control unit 410 corresponds to the control unit 120 or the control unit 120A.

It should be noted that the control unit 410 included in the memory management unit 400 may be implemented to a hardware such as a Large Scale Integration (LSI). Or, the control unit 410 may be a module of a program executed by a processor such as a Central Processing Unit (CPU).

Although only some exemplary embodiments of the present invention have been described above for the memory management unit or the data storage device, the present invention is not limited to the embodiments. Those skilled in the art will be readily appreciated that various modifications of the exemplary embodiments and combinations of the structural elements of the different embodiments are possible without materially departing from the novel teachings and advantages of the present invention. Accordingly, all such modifications and combinations are intended to be included within the scope of the present invention.

It should be noted that all or a part of the structural elements of the above-described memory management unit may be implemented to a hardware. It should also be noted that all or a part of the structural elements of the above-described memory management unit may be a module of a program executed by a CPU or the like.

It should be noted that all or a part of the structural elements of the above-described memory management unit 100 or memory management unit 100A may be implemented to a single system LSI. The system LSI is a super multi-function LSI that is a single chip into which a plurality of structural elements are integrated. More specifically, the system LSI is a computer system including a microprocessor, a Read Only Memory (ROM), a Random Access Memory (RAM), and the like.

For example, the memory management unit 100 or the memory management unit 100A may be implemented to a single system LSI. In other words, the memory management unit 100 or the memory management unit 100A may be an integrated circuit.

It should also be noted that the present invention may be implemented as a memory management method including steps performed by the characterized structural units included in the memory management unit 100 or the memory management unit 100A. The present invention may be implemented as a program causing a computer to execute the steps included in the above memory management method. The present invention may be implemented as a computer-readable recording medium on which the above program is recorded. The program may be distributed via a transmission medium such as the Internet.

The embodiments described herein are mere exemplary embodiments of the present invention and do not limit the present invention. The scope of the present invention is not in the above description but in the claims. Many modifications are possible within the meanings and the scope of the claims.

INDUSTRIAL APPLICABILITY

The present invention is suitable for devices which are accessed by bank interleaving and require power saving.

The invention claimed is:

1. A memory management unit that manages a state of a memory, wherein the memory includes p banks, where p is an integer of 2 or greater, and u memory regions, where u is an integer of 4 or greater, the u memory regions being arranged in a matrix in one of a physical memory space and a logical memory space, the u memory regions form a region matrix in n rows and p columns, where n is an integer of 2 or greater, each of the p banks corresponds to a corresponding one of the p columns in the region matrix, each of the p banks includes n memory regions that correspond to a column corresponding to the each of the p banks in the region matrix, the memory includes n unit regions to be accessed by bank interleaving, each of the n unit regions corresponds to a corresponding one of the n rows in the region matrix, each of the n unit regions includes p memory regions that correspond to a row corresponding to the each of the n unit regions in the region matrix, each of the n unit regions corresponds to a corresponding one of n segments necessary in accessing the memory, each of the n segments indicates identification information for identifying a reserved region that is a memory region reserved by the each of the n segments from among the p memory regions included in a unit region corresponding to the each of the n segments, the memory management unit comprising a control unit configured to dynamically determine, from among the p banks, a bank to be accessed, wherein the control unit includes a segment setting unit configured to update identification information indicated by a segment to be updated from among the n segments, for each processing which requires to update the segment and is performed to access the unit region, and when a predetermined condition for a reserving state of the memory is satisfied, an access method is bank interleaving and an unused bank not to be accessed exists in the p banks, the control unit is configured to perform power consumption reduction to control the memory to cause power consumption of the unused bank to be less than power consumption of other bank in the p banks except the unused bank.

2. The memory management unit according to claim 1, wherein the memory has a function of performing auto refresh processing and a function of performing self refresh processing, the functions being used to hold data, a power consumption requirement of the self refresh processing is lower than a power consumption requirement or the auto refresh processing, the control unit includes a power consumption control unit configured to perform the power consumption reduction to control the memory to perform the self refresh processing on the unused bank, wherein the auto refresh processing is performed on the other bank except the unused bank.

3. The memory management unit according to claim 1, wherein the predetermined condition is that (i) a total capacity of all of reserved regions identified by respective pieces of the identification information most recently indicated by the respective segments is no greater than a predetermined first threshold value, and (ii) access is performed by bank interleaving in k bank, where k is an integer of 2 or greater and less than n.

4. The memory management unit according to claim 1, wherein each of the n segments indicates effectiveness determination information indicating whether or not the each of the n segments is effective, the segment setting unit is configured to update at least one of (a) the identification information, and (b) the effectiveness determination information indicated by the segment to be updated, for each processing which requires to update the segment and is performed to access the unit region, and the predetermined condition is that (i) a total capacity of all of reserved regions identified by respective pieces of the identification information most recently indicated by the respective segments is no greater than a predetermined first threshold value, (ii) a total number of segments indicated as effective is no greater than a predetermined second threshold value, and (iii) access is performed by bank interleaving in k bank, where k is an integer of 2 or greater and less than n.

5. The memory management unit according to claim 4, wherein the predetermined second threshold value is smaller than n/2.

6. The memory management unit according to claim 3, wherein the predetermined first threshold value is smaller than a half of a total capacity of the u memory regions.

7. The memory management unit according to claim 3, wherein each of the n segments indicates a start address of a corresponding one of the unit regions.

8. The memory management unit according to claim 3, wherein the identification information indicates a capacity reserved by a segment indicating the identification information, the identification information being indicated in a unit region corresponding to the segment, and the capacity indicated in the identification information is set for each of the p memory regions corresponding to a bank corresponding to the unit region.

9. An image processing device performing image processing using the memory management unit according to claim 1.

10. An integrated circuit that manages a state of a memory, wherein the memory includes p banks, where p is an integer of 2 or greater, and u memory regions, where u is an integer of 4 or greater, the u memory regions being arranged in a matrix in one of a physical memory space and a logical memory space, the u memory regions form a region matrix in n rows and p columns, where n is an integer of 2 or greater, each of the p banks corresponds to a corresponding one of the p columns in the region matrix, each of the p banks includes n memory regions that correspond to a column corresponding to the each of the p banks in the region matrix, the memory includes n unit regions to be accessed by bank interleaving, each of the n unit regions corresponds to a corresponding one of the n rows in the region matrix, each of the n unit regions includes p memory regions that correspond to a row corresponding to the each of the n unit regions in the region matrix, each of the n unit regions corresponds to a corresponding one of n segments necessary in accessing the memory, each of the n segments indicates identification information for identifying a reserved region that is a memory region reserved by the each of the n segments from among the p memory regions included in a unit region corresponding to the each of the n segments, the integrated circuit comprising a control unit configured to dynamically determine, from among the p banks, a bank to be accessed, wherein the control unit includes a segment setting unit configured to update identification information indicated by a segment to be updated from among the n segments, for each processing which requires to update the segment and is performed to access the unit region, and when a predetermined condition for a reserving state of the memory is satisfied, an access method is bank interleaving and an unused bank not to be accessed exists in the p banks, the control unit is configured to perform power consumption reduction to control the memory to cause power consumption of the unused bank to be less than power consumption of other bank in the p banks except the unused bank.

* * * * *